(12) United States Patent
Tsubuku et al.

(10) Patent No.: US 11,927,859 B2
(45) Date of Patent: Mar. 12, 2024

(54) DISPLAY DEVICE AND METHOD FOR MANUFACTURING DISPLAY DEVICE

(71) Applicant: Japan Display Inc., Tokyo (JP)

(72) Inventors: Masashi Tsubuku, Tokyo (JP); Takeshi Sakai, Tokyo (JP); Tatsuya Toda, Tokyo (JP)

(73) Assignee: Japan Display Inc., Tokyo (JP)

( * ) Notice: Subject to any disclaimer, the term of this patent is extended or adjusted under 35 U.S.C. 154(b) by 56 days.

(21) Appl. No.: 17/447,740

(22) Filed: Sep. 15, 2021

(65) Prior Publication Data

US 2022/0004039 A1 Jan. 6, 2022

Related U.S. Application Data

(63) Continuation of application No. PCT/JP2020/011184, filed on Mar. 13, 2020.

(30) Foreign Application Priority Data

Mar. 28, 2019 (JP) .................. 2019-063815

(51) Int. Cl.
*G02F 1/1368* (2006.01)
*H10K 59/124* (2023.01)
(Continued)

(52) U.S. Cl.
CPC ......... *G02F 1/1368* (2013.01); *H10K 59/124* (2023.02); *H10K 71/00* (2023.02); *H10K 59/1201* (2023.02)

(58) Field of Classification Search
CPC ... H01L 21/441; H01L 27/32; H01L 27/1225; H01L 27/3258; H01L 51/56;
(Continued)

(56) References Cited

U.S. PATENT DOCUMENTS

2006/0113536 A1 6/2006 Kumomi et al.
2007/0241327 A1 10/2007 Kim et al.
(Continued)

FOREIGN PATENT DOCUMENTS

CN 104335355 A * 2/2015 ............. C23C 14/08
JP 2015195371 A 11/2015
(Continued)

OTHER PUBLICATIONS

International Search Report dated Jun. 9, 2020 in PCT/JP2020/011184 filed on Mar. 13, 2020, 2 pages.
(Continued)

*Primary Examiner* — Hoan C Nguyen
(74) *Attorney, Agent, or Firm* — Maier & Maier, PLLC

(57) ABSTRACT

A display device comprising a transistor and a display element over the transistor, wherein the transistor includes a gate electrode on an insulating surface, a gate insulating layer on the gate electrode, and source/drain electrodes on the oxide semiconductor layer and the gate insulating layer, each including a first conductive layer containing nitrogen and a second conductive layer on the first conductive layer, and an insulating layer contains oxygen on the oxide semiconductor layer and the source/drain electrodes.

13 Claims, 21 Drawing Sheets

(51) Int. Cl.
*H10K 71/00* (2023.01)
*H10K 59/12* (2023.01)

(58) Field of Classification Search
CPC ........... H01L 2227/323; H01L 27/3244; H01L 29/7869; H01L 29/78696; H01L 29/45; H01L 29/41733; H01L 21/02617; H01L 21/02565; H01L 29/66969; H01L 29/4908; H01L 21/477; H01L 21/02554; H01L 29/66742; G02F 1/1368; G02F 1/1362; H10K 59/1213
See application file for complete search history.

(56) References Cited

U.S. PATENT DOCUMENTS

| | | | | |
|---|---|---|---|---|
| 2011/0240987 A1* | 10/2011 | Lee | ................... | H01L 29/78696 438/156 |
| 2012/0326144 A1* | 12/2012 | Ohta | ................. | H01L 21/02617 257/43 |
| 2014/0110703 A1 | 4/2014 | Yamazaki | | |
| 2014/0339542 A1 | 11/2014 | Yamazaki et al. | | |
| 2015/0077162 A1* | 3/2015 | Yamazaki | .............. | G11C 19/28 327/212 |
| 2015/0270407 A1 | 9/2015 | Suzuki et al. | | |
| 2017/0352689 A1* | 12/2017 | Chung | ................ | H01L 27/1225 |

FOREIGN PATENT DOCUMENTS

| | | | |
|---|---|---|---|
| KR | 1020070103231 A | 10/2007 | |
| WO | WO-2017002672 A1 * | 1/2017 | ............. H01L 21/28 |

OTHER PUBLICATIONS

Japanese Office Action dated Oct. 25, 2022 in corresponding Japanese Application No. 2019-063815; 6 pages.
Office Action dated Jan. 24, 2023, in corresponding Japanese Application No. 2019-063815, 8 pages.
Office Action dated Sep. 19, 2023, in corresponding Korean Application No. 10-2021-7032976, 9 pages.
Office Action dated Apr. 11, 2023, in corresponding to Japanese Application No. 2019-063815, 10 pages.

* cited by examiner

DISPLAY DEVICE AND METHOD FOR MANUFACTURING DISPLAY DEVICE

CROSS REFERENCE TO RELATED APPLICATIONS

This application is a U.S. continuation application filed under 35 U.S.C. § 111(a), of International Application No. PCT/JP2020/011184, filed on Mar. 13, 2020, which claims priority to Japanese Patent Application No. 2019-063815, filed on Mar. 28, 2019, the disclosures of which are incorporated herein by reference.

FIELD

One embodiment of the present invention relates to a display device and methods for manufacturing a display device.

BACKGROUND

A liquid crystal display device utilizing the electro-optic effect of liquid crystals and an organic electroluminescent display device using organic electroluminescent (organic EL) elements have been developed as a display device for use in electric appliances and electronic equipment. Conventionally, transistors using silicon as a semiconductor layer have been used in these display devices. In recent years, display devices with a large area, a high resolution, a high frame rate, and the like have been increasingly demanded. Efforts to satisfy these requirements are actively underway.

Recently, transistors using an oxide semiconductor are being developed instead of using silicone. The transistors using an oxide semiconductor are expected to achieve high mobility. Furthermore, an oxide semiconductor can be formed with a large area and has advantages in high pressure resistance as compared to amorphous silicon. Japanese Patent Application Laid-Open No. 2006-165528 discloses a display device using an oxide semiconductor.

SUMMARY

A display device according to an embodiment of the present invention includes: a transistor and a display element over the transistor. The transistor includes a gate electrode on an insulating surface; a gate insulating layer on the gate electrode; an oxide semiconductor layer on the gate insulating layer overlapping the gate electrode; source/drain electrodes on the oxide semiconductor layer and the gate insulating layer, each including a first conductive layer containing nitrogen and a second conductive layer on the first conductive layer and; an insulating layer containing oxygen on the oxide semiconductor layer and the source/drain electrodes.

A method for manufacturing a display device according to an embodiment of the present invention includes forming a gate electrode on an insulating surface, forming a gate insulating layer on the gate electrode, forming an oxide semiconductor layer including a region overlapping the gate electrode on the gate insulating layer, forming source/drain electrodes on the oxide semiconductor layer and the gate insulating layer, each including a first conductive layer containing nitrogen and a second conductive layer on the first conductive layer, forming an insulating layer on the source/drain electrodes, forming a transistor by performing a heat treatment, and forming a display element on the transistor.

DESCRIPTION OF EMBODIMENTS

Figure 1:
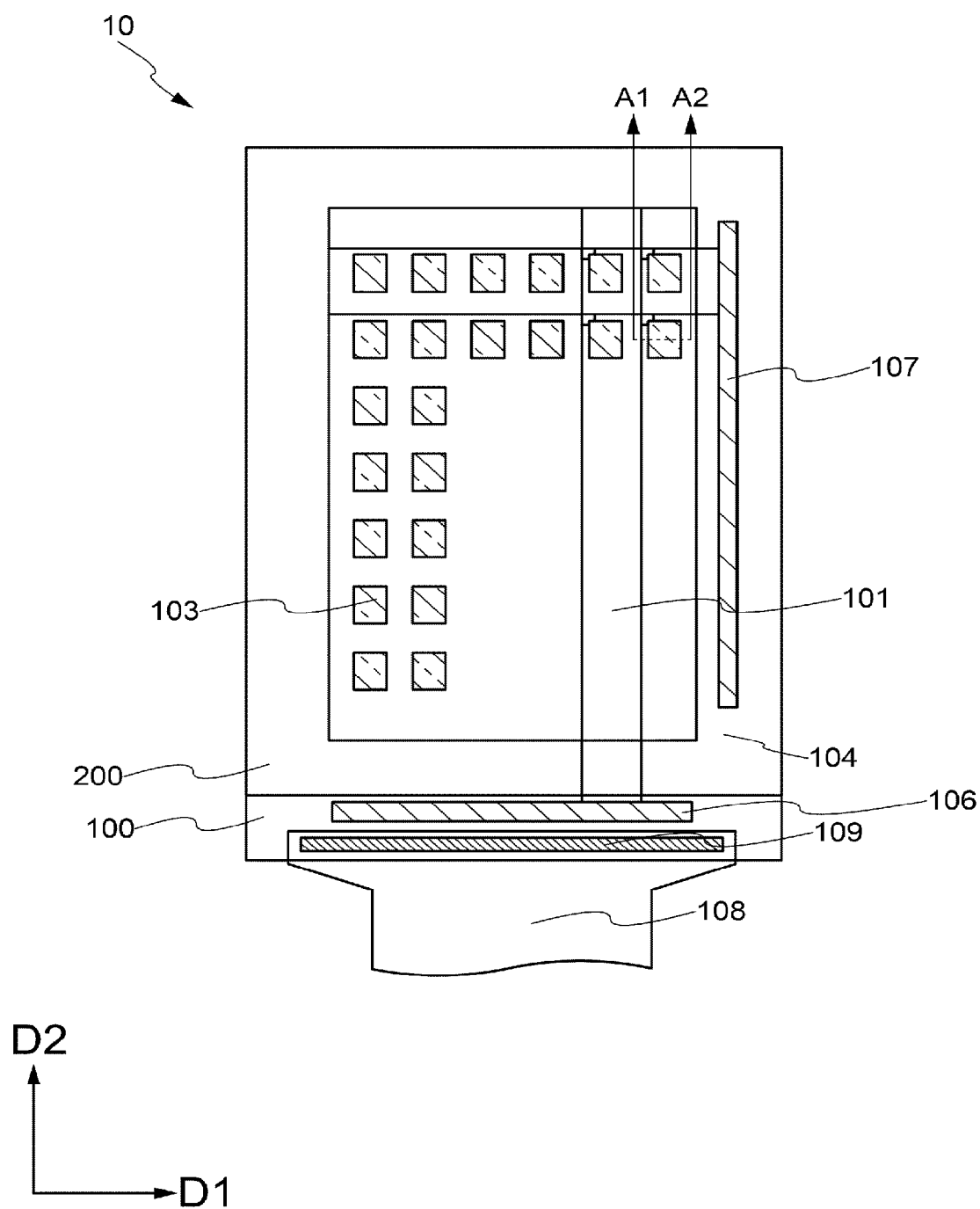
FIG. 1 is a plan view of a display device according to an embodiment of the present invention.

A transistor using an oxide semiconductor may show characteristic variations in a reliability test depending on the processing temperature during the manufacturing process. Transistor performance variation may cause various defects, such as display unevenness in a display device. Therefore, further improvement in the reliability of the transistor is required.

One object of the present disclosure is to provide a display device having a transistor with improved reliability. Another object of the present disclosure is to provide a highly reliable display device.

Embodiments of the present invention will be described below with reference to the drawings and the like. However, the present invention can be implemented in many different modes, and should not be construed as being limited to the description of the following embodiments. For the sake of clarity of explanation, although the drawings may be schematically represented with respect to widths, thicknesses, shapes, and the like of the respective portions in comparison with actual embodiments, they are merely an example and do not limit the interpretation of the present invention. In this specification and each of the drawings, the same reference numerals (or reference numerals denoted by A, B, and the like) are given to the same elements as those described above with reference to the preceding drawings, and a detailed description thereof may be omitted as appropriate. In addition, the letters "first" and "second" attached to each element are convenient labels used to distinguish each element and have no further meaning unless otherwise stated.

In this specification, when a member or region is "above (or below)" another member or region, it includes not only being directly above (or below) another member or region, but also being above (or below) another member or region including other components therebetween unless otherwise limited. In the following explanation, unless otherwise specified, in a cross-sectional view, the side on which a second substrate is arranged with respect to a first substrate is referred to as "on" or "over", and the opposite side is referred to as "below" or "under".

In this specification, "A and B are connected" means not only that A and B are directly connected, but A and B are electrically connected. Here, the term "A and B are electrically connected" means that an electric signal can be exchanged between A and B when an object having some electric action exists between A and B.

In addition, in the case of components which can be recognized by a person ordinarily skilled in the art to which the present invention pertains, no special explanation shall be provided.

First Embodiment (1-1. Configuration of Display Device)

FIG. 1 shows top view of a display device 10. In FIG. 1, the display device 10 has a substrate 100, a substrate 200, a display portion 101 having a plurality of pixels 103, a peripheral portion 104, a driving circuit 106 having a function as a source driver, a driving circuit 107 having a function as a gate driver, a flexible printed substrate 108, and a terminal portion 109.

In FIG. 1, the pixels 103 are provided in a matrix. The pixel 103 includes a display element (a light emitting element 130 described later). The peripheral portion 104 is arranged on the outer side of the display portion 101 and is provided to surround the display portion 101. The pixel 103, the driving circuit 106, the driving circuit 107 and the flexible printed substrate 108 are electrically connected, respectively. Information (signals) from external devices is input to the driving circuit 106 and the driving circuit 107 via the flexible printed substrate 108 and the terminal portion 109.

Figure 2:
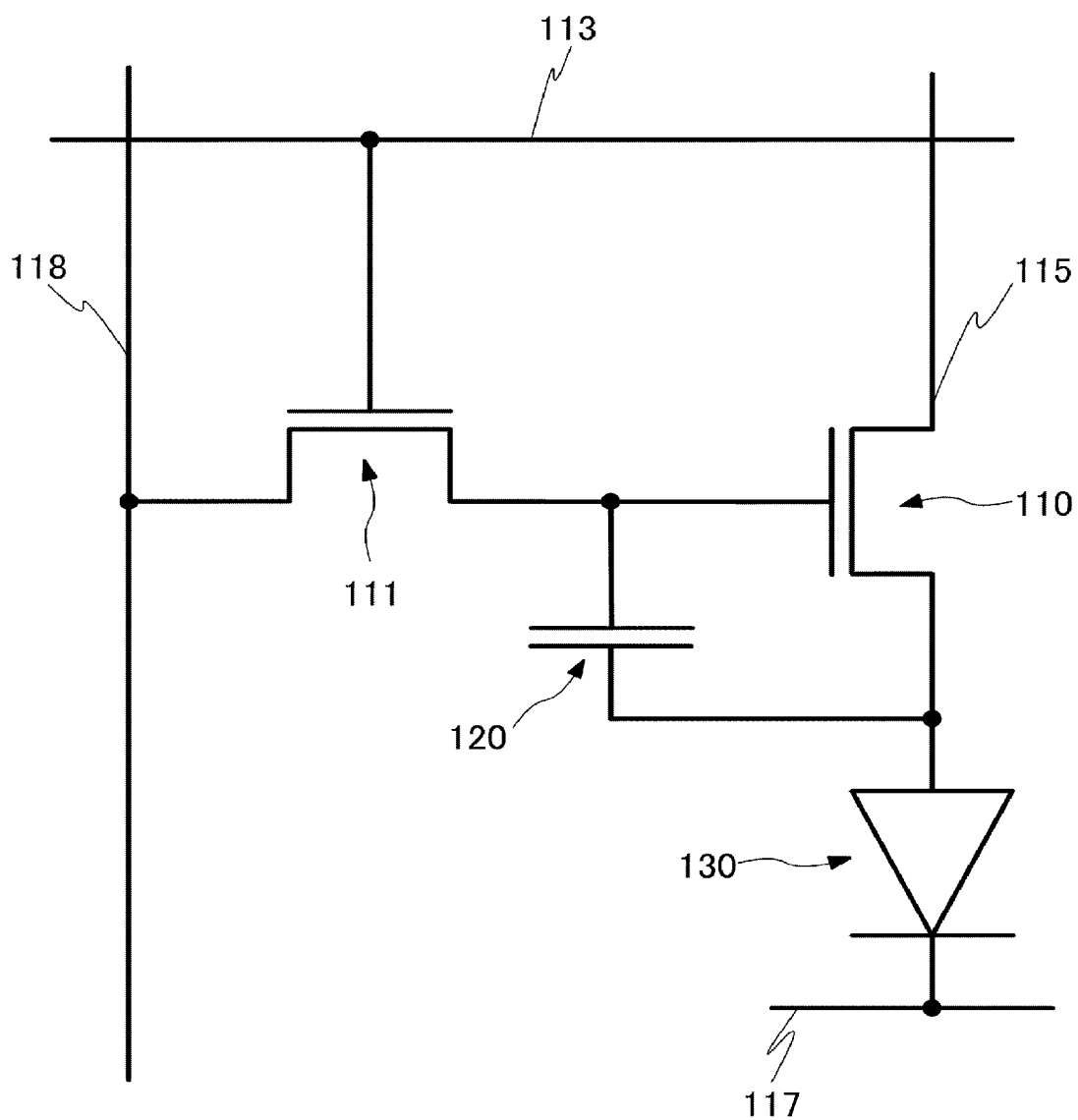
FIG. 2 is a circuit diagram of a pixel circuit of a display device according to an embodiment of the present invention.

FIG. 2 shows a circuit diagram of a pixel circuit 30 of the pixel 103 in the display device 10. A circuit configuration of the pixel circuit 30 described below is an example, and is not limited thereto.

Each of a plurality of pixel circuits 30 includes at least a transistor 110, a transistor 111, a light emitting element 130 and a capacity element 120. The transistors 110 and 111 can also be referred to collectively as a semiconductor device.

The transistor 110 is connected to the light emitting element 130. The transistor 110 controls the emission brightness of the light emitting element 130. The transistor 110 controls a drain current by a voltage between the gate and source. The transistor 110 has a gate connected to one of the source or drain of the transistor 111. One of the source or drain in the transistor 110 is connected to a driving power supply line 115. The other of the source or drain in the transistor 110 is connected to the anode of the light emitting element 130.

The transistor 111 controls the conduction state between a signal line 118, which transmits a video signal from the driving circuit 106, and the gate of the transistor 110 by on-off operation. A gate in the transistor 111 is connected to a scanning line 113 which transmits a scanning signal. A source in the transistor 111 is connected to the signal line 118. A drain in the transistor 111 is connected to the gate of the transistor 110.

In the light emitting element 130, an anode is connected to the drain of the transistor 110 and a cathode is connected to a reference power supply line 117.

The capacity element 120 is connected between the gate and the drain of the transistor 110. The capacity element 120 holds a voltage between the gate and drain of the transistor 110.

The reference power supply line 117 is provided in common to the plurality of pixels 103. A constant potential is provided to the reference power supply line.

Based on the configuration described above, a video signal transmitted from the driving circuit 106 and a scanning signal transmitted from the driving circuit 107 are input to the respective pixels 103. As a result, a still image and a moving image are displayed on the display unit 101.

(1-2. Cross-Sectional Configuration of Pixel)

Next, the respective configurations of the pixel 103 in the display device 10 will be described with reference to the drawings.

Figure 3:
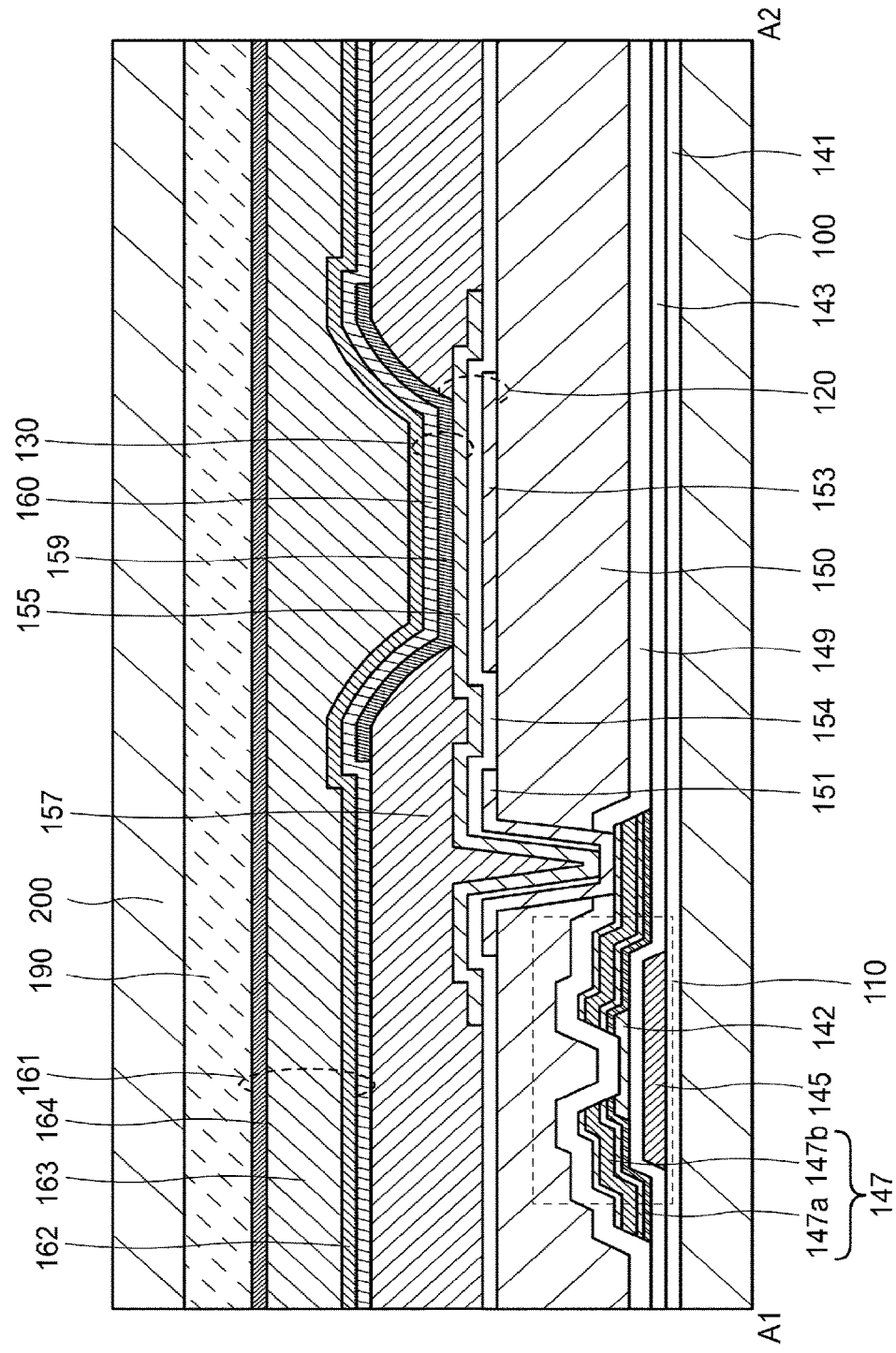
FIG. 3 is a cross-sectional view of pixels of a display device according to an embodiment of the present invention.

FIG. 3 is cross-sectional view between A1-A2 of the pixel 103 in the display device 10 shown in FIG. 1. As shown in FIG. 3, the pixel 103 includes a substrate 100, the transistor 110, a sealing layer 120, the light emitting element 130, an insulating layer 141, a planarization layer 150, a rib 157, a sealing layer 161, an adhesive layer 190 and the substrate 200. Each configuration will be described in detail below.

(1-2-1. Transistor Configuration)

Figure 4:
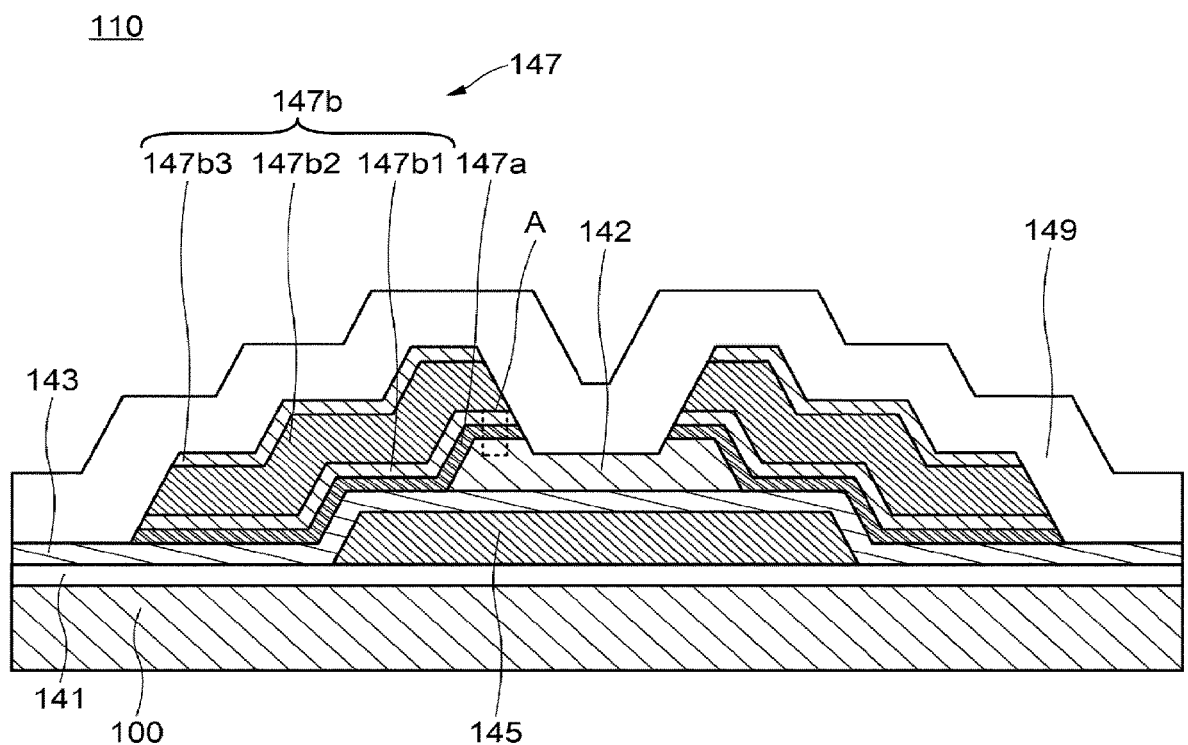
FIG. 4 is a cross-sectional view of a transistor according to an embodiment of the present invention.

FIG. 4 is an enlarged cross-sectional view of the transistor 110 of FIG. 3. The transistor 110 has a gate electrode 145, a gate insulating layer 143, an oxide semiconductor layers 142, source/drain electrodes 147, and an insulating layer 149. In the present embodiment, the transistor 110 has a bottom gate and top contact structure.

The gate electrode 145 is provided on the insulating layer 141, that is, an insulating surface. The gate electrode 145 is made of, for example, aluminum (Al), titanium (Ti), chromium (Cr), cobalt (Co), nickel (Ni), zinc (Zn), molybdenum (Mo), copper (Cu), indium (In), tin (Sn), hafnium (Hf), tantalum (Ta), tungsten (W), platinum (Pt), and bismuth (Bi), or the like. Alloys of these metals may be used for the gate electrode 145. For the gate electrode 145, a conductive oxide such as ITO (indium tin oxide), IGO (indium gallium oxide), IZO (indium zinc oxide), or GZO (zinc oxide to which gallium is added as a dopant) may be used. These films may be laminated.

A high dielectric constant material is used for the gate insulating layer 143. The gate insulating layer 143 can be made of, for example, silicon nitride $SiN_x$, silicone oxide $SiO_x$, silicon oxynitride $(SiO_xN_y)$, aluminum nitride $(AlN_x)$, aluminum oxide $(AlO_x)$, aluminum oxide $(AlO_xN_y)$, and so on (x, y are any integers). The gate insulating layer 143 may be a single layer or stacked structure of the materials described above. The gate insulating layer 143 in contact with an oxide semiconductor layer 142 is preferably an oxygen-containing insulating layer such as a silicon oxide layer.

The oxide semiconductor layer 142 is provided on the gate insulating layer 143. The oxide semiconductor layer 142 overlaps the gate electrode 145. The oxide semiconductor layer 142 may include a group 13 element such as indium and gallium. The oxide semiconductor layer 142 may contain a plurality of distinct a group 13 elements. The oxide semiconductor layer 142 may further include a group 12 element. For example, a IGZO containing indium, gallium, and zinc is used for the oxide semiconductor layer 142.

The oxide semiconductor layer 142 may include other elements. In this case, the oxide semiconductor layer 142 may contain tin as a group 14 element, and titanium, zirconium, or the like as a group 4 element.

Alternative embodiments of the oxide semiconductor layer 142 may include materials such as $InO_x$, $ZnO_x$, SnOx, In—Ga—O, In—Zn—O, In—Al—O, In—Sn—O, In—Hf—O, In—Zr—O, In—W—O, In—Y—O, In—Ga—Zn—O, In—Al—Zn—O, In—Sn—Zn—O, In—Hf—Zn—O, In—Ga—Sn—O, In—Al—Sn—O, In—Hf—Sn—O, In—Ga—Al—Zn—O, In—Ga—Hf—Zn—O, In—Sn—Ga—Zn—O. The crystallinity of the oxide semiconductor layer 142 is not limited and may be monocrystalline, polycrystalline, microcrystalline, or amorphous.

It is preferable that the oxide semiconductor layer 142 has few crystalline defects such as oxygen-deficiency. It is preferable that the oxide semiconductor layer 142 has a lower concentration of hydrogen.

The source/drain electrodes 147 includes a conductive layer 147a (also referred to as a first conductive layer) and a conductive layer 147b (also referred to as a second conductive layer). The conductive layer 147a is provided on the oxide semiconductor layer 142 and the gate insulating layer 143. The conductive layer 147a includes nitrogen together with a metallic material. Titanium nitride $(TiN_x)$ is used for conductive layer 147a in the present embodiment. The conductive layer 147a contains nitrogen and therefore has a function of preventing oxygen from diffusing to the conductive layer 147b while diffusing oxygen from the oxide semiconductor 142 to a part of the conductive layer 147a. Furthermore, the conductive layer 147a is not limited to titanium nitride, and tantalum nitride $(TaN_x)$, molybdenum nitride $(MoN_x)$, or tungsten nitride $(WN_x)$ may be used (x is an optional integer). A thickness of the conductive layer 147a may be set as appropriate, and is preferably 10 nm or more and 30 nm or less.

The conductive layer 147b is provided on the conductive layer 147a. A metallic material having a lower resistance is used for the conductive layer 147b. Aluminum (Al), titanium (Ti), chromium (Cr), cobalt (Co), nickel (Ni), zinc (Zn), molybdenum (Mo), copper (Cu), indium (In), tin (Sn), hafnium (Hf), tantalum (Ta), tungsten (W), platinum (Pt), bismuth (Bi), or the like is used for the conductive layer 147b. An alloy of these metals may be used for the conductive layer 147b. These films may be laminated to form the conductive layer 147b. In the present embodiment, a conductive layer 147b1, a conductive layer 147b2 and a conductive layer 147b3 are laminated to form the conductive layer 147b. Titanium is used for the conductive layer 147b1 and the conductive layer 147b3 in this example. Aluminum is used for the conductive layer 147b2 in this example. A thickness of the conductive layer 147b may be set as appropriate, and is preferably 50 nm or more and 1000 nm or less.

Figure 5:
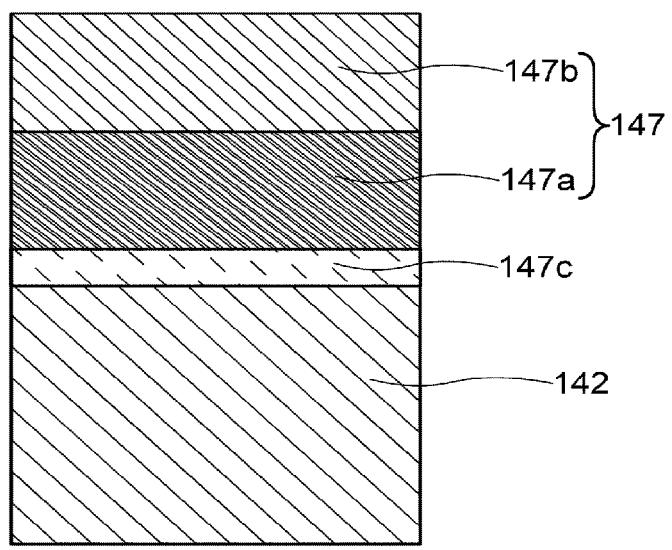
FIG. 5 is an enlarged cross-sectional view of a portion of a transistor according to an embodiment of the present invention.

FIG. 5 is an enlarged view of the oxide semiconductor layer 142 and the source/drain electrodes 147 of region A shown in FIG. 4. At this time, as shown in FIG. 5, a conductive layer 147c (also referred to as a third conductive layer) may be provided between the oxide semiconductor layer 142 and the conductive layer 147a of the source/drain electrodes 147. As will be described later, the conductive layer 147c includes the metallic materials of the conductive layer 147a and the oxygen diffused from the oxide semiconductor layer 142. It is desirable that the content of oxygen contained in the conductive layer 147c is 5 atomic % or more and 20 atomic % or less. The conductive layer 147c may further include a part of the metallic materials included in the oxide semiconductor layer 142. The thickness of conductive layer 147c is preferably 2 nm or more and 10 nm or less. Thus, the conductive layer 147c can have conductivity.

The description will return to FIG. 4. The insulating layer 149 is provided on the oxide semiconductor layer 142, the source/drain electrodes 147 and the gate insulating layer 143. An Insulating material containing oxygen may be used for the insulating layer 149. For example, the insulating layer 149 is made of $SiO_x$, (x is any integer). Further, the insulating layer 149 is not limited to silicone oxide, and silicon oxynitride $(SiO_xN_y)$, aluminum $(AlO_x)$, or aluminum oxynitride $(AlO_xN_y)$ can also be used (x, y is an optional integer). The insulating layer 149 is preferably a film capable of releasing oxygen by a heat treatment. The insulating layer 149 preferably has a small defect level density.

In the transistor 110 of the present embodiment, the source/drain electrodes have a nitrogen-containing conductive layer on the oxide semiconductor layer 142 side. Therefore, the diffusion of oxygen from the oxide semiconductor layer 142 can be suppressed. When the heat treatment is performed, oxygen diffuses from the oxide semiconductor layer to the source/drain electrodes (specifically, the conductive layer 147a) to form a conductive region, and the oxide as the entire source/drain electrodes (specifically, the conductive layer 147b) can be suppressed. Thus, it is possible to reduce the variation in the characteristics of the transistor 110. Therefore, the reliability of the display performance in display device can be improved as well as the reliability of the transistor 110.

(1-2-2. Other Configuration of Display Device)

Referring back to FIG. 3, the other components of the display device 10 will be described below.

A glass substrate or an organic resin substrate is used for the substrate 100. For example, polyimide is used for the organic resin substrate. The organic resin substrate is not limited to polyimide, and polyethylene terephthalate, polyethylene naphthalate, triacetyl cellulose, cyclic olefin copolymer, cycloolefin polymer, and the like may be used. Thicknesses of the substrate 100 and the substrate 200 can be appropriately set. In the case of an organic resin substrate, a sheet display having flexibility can be realized.

The insulating layer 141 has a function as a base film. Silicon oxide, silicon oxide nitride, silicon nitride or the like is used for the insulating layer 141. The insulating layer 141 may be a single layer or a laminate layer. By using the above materials, impurities, typically alkaline metals, water, hydrogen, and the like from the substrate 100 can be prevented from diffusing into the oxide semiconductor layer 142.

A planarization layer 150 is provided on the insulating layer 149. A resin such as polyimide, polyamide, acrylic, epoxy, or the like is used for the planarization layer 150. These materials have the advantage that it is possible to form a film using a solution coating method and have a high flattening effect. The insulating layer 149 and the planarization layer 150 are provided with an opening.

An insulating layer 154 as a dielectric, a conductive layer 153, and a pixel electrode 155 are used for the capacity element 120. A conductive layer 151 provided in the same layer of the conductive layer 153 is connected to the source/drain electrodes 147 and to the pixel electrode 155.

The pixel electrode 155, an organic EL layer 159, and a counter electrode 160 are used for light emitting element 130. The light emitting element 130 has a so-called top-emission type structure that emits light emitted by the organic EL layer 159 toward the counter electrode 160.

The organic EL layer 159 is provided on the pixel electrode 155. The organic EL layer 159 comprises a light emitting material such as an organic electroluminescent material. In addition, a positive hole transport material or an electron-transport material may be used as the organic EL layer 159 in addition to a light-emitting material. The organic EL layer 159 of this embodiment may be provided by stacking light-emitting materials for emitting light. In this case, the display device 10 may display R, G, and B colors through color filters.

The ribs 157 are formed of organic resinous materials to cover the periphery region of the pixel electrode 155 and to form a smooth step at an end portion of the pixel electrode 155. In order to increase the contrast ratio of the display image, an organic resin material containing a black pigment may be used for the rib 157.

The sealing layer 161 is arranged on the light emitting element 130 and the rib 157. The sealing layer 161 includes an inorganic insulating layer 162, an organic insulating layer 163 and an inorganic insulating layer 164.

An insulating film such as silicon nitride, silicon oxide, aluminum oxide, or the like is used for the inorganic insulating layers 162 and 164. A thickness of the inorganic insulating layer 162 and the inorganic insulating layer 164 is preferably 30 nm or more and 1 µm or less. With the above-mentioned structure, even if a defect such as a pinhole or the like is formed in a part thereof, the other inorganic insulating layer can compensate for the defect and more effectively suppress the entry of water.

A material such as an acrylic resin, a polyimide resin, or an epoxy resin can be used for the organic insulating layer 163. A thickness of the organic insulating layer 163 is preferably 1 µm or more and 20 µm or less, and preferably 3 µm or more and 10 µm or less.

By having the organic insulating layer 163 between the inorganic insulating layers 162 and 164, the surface of the organic insulating layer 163 is planarized even when foreign matter is mixed in forming the sealing layer 161. This increases the coverage of the inorganic insulating layer 164. Therefore, the water blocking performance can be stably maintained.

The substrate 200 may be provided on the inorganic insulating layer 164 via the adhesive layer 190. For example, an adhesive member such as an acrylic, a rubber, silicone, or urethane can be used for the adhesive layer 190. The substrate 200 may include a touch panel. The substrate 200 may also have optical capabilities such as a polarizer. The adhesive layer 190 may contain a hygroscopic material such as calcium or zeolite. By including a water absorbing material in the adhesive layer 190, even when water enters the interior of the display device 10, the water can be delayed from reaching light emitting element 130.

A glass substrate, a quartz substrate and a flexible substrate (polyimide, polyethylene terephthalate, polyethylene naphthalate, triacetyl cellulose, a cyclic olefin-copolymer, a cycloolefin polymer, and other resin substrates having flexibility) can be used for the substrate 200.

The adhesive layer 190 may include a spacer to ensure a gap between the substrate 100 and the substrate 200. Such a spacer may be mixed into the adhesive layer 190 or may be formed on the substrate 100 by a resin or the like.

(1-3. Method for Manufacturing a Transistor)

Next, a manufacturing method of the transistor 110 in the display device 10 will be described while referring to FIGS. 6 to 10.

Figure 6:
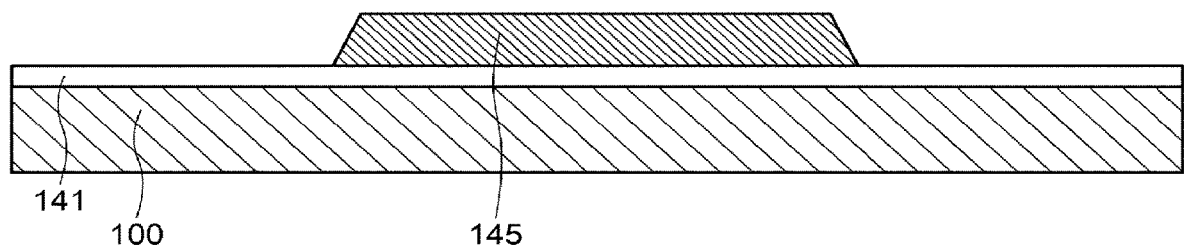
FIG. 6 is a cross-sectional view of a method for manufacturing a transistor according to an embodiment of the present invention.

First, as shown in FIG. 6, the gate electrode 145 is formed on the insulating layer 141.

After a conductive film is deposited on the insulating layer 141 provided on the substrate 100, the gate electrode 145 is formed by processing to the desired shape using a patterning method and an etching method. The conductive film is formed in a single layer or stacked layer structure by a sputtering method using the above-described materials. A thickness of the gate electrode 145 is preferably 100 nm or more and 500 nm or less. In the present embodiment, an alloyed film of molybdenum and tungsten is used for the gate electrode 145.

Figure 7:
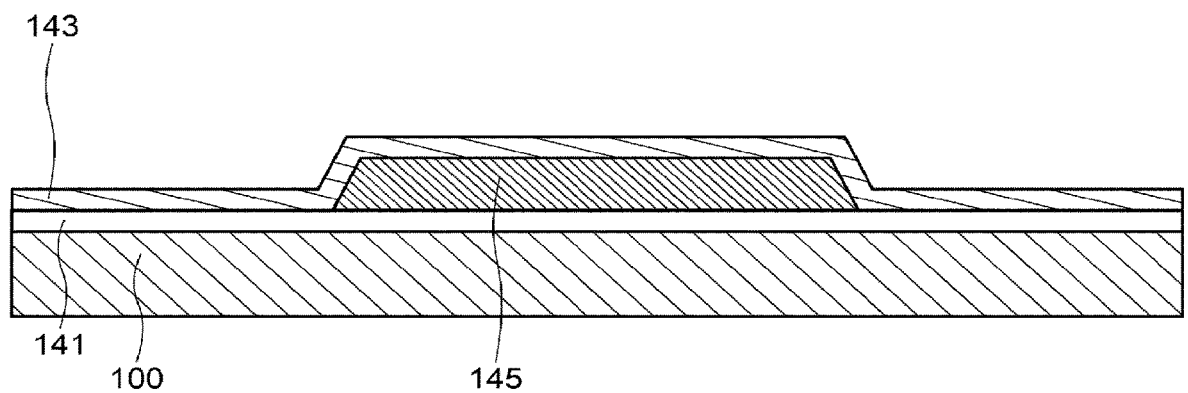
FIG. 7 is a cross-sectional view of a method for manufacturing a transistor according to an embodiment of the present invention.

Next, as shown in FIG. 7, the gate insulating layer 143 is deposited on the gate electrode 145 and the insulating layer 141. The gate insulating layer 143 is formed of a single layer or stacked layer structure using the materials described above by sputtering, thermal chemical vapor deposition, or plasma-enhanced chemical vapor deposition. In this case, the forming temperature of the gate insulating layer 143 is desirably 325° C. or more and 450° C. or less, and preferably 350° C. or more and 400° C. or less. A thickness of the gate insulating layer 143 is preferably greater than or equal to 50 nm or more and 500 nm or less.

The gate insulating layer 143 is preferably formed using a material capable of releasing oxygen by a heat treatment. For example, silicon oxide is preferably used for the gate insulating layer 143. By performing the heat treatment after forming the oxide semiconductor layer 142, oxygen is released from the gate insulating layer 143, oxygen deficiencies in the oxide semiconductor layer 142 can be repaired, and variation in transistor characteristics can be suppressed. Thus, it is possible to improve the reliability of the transistor characteristics.

Figure 8:
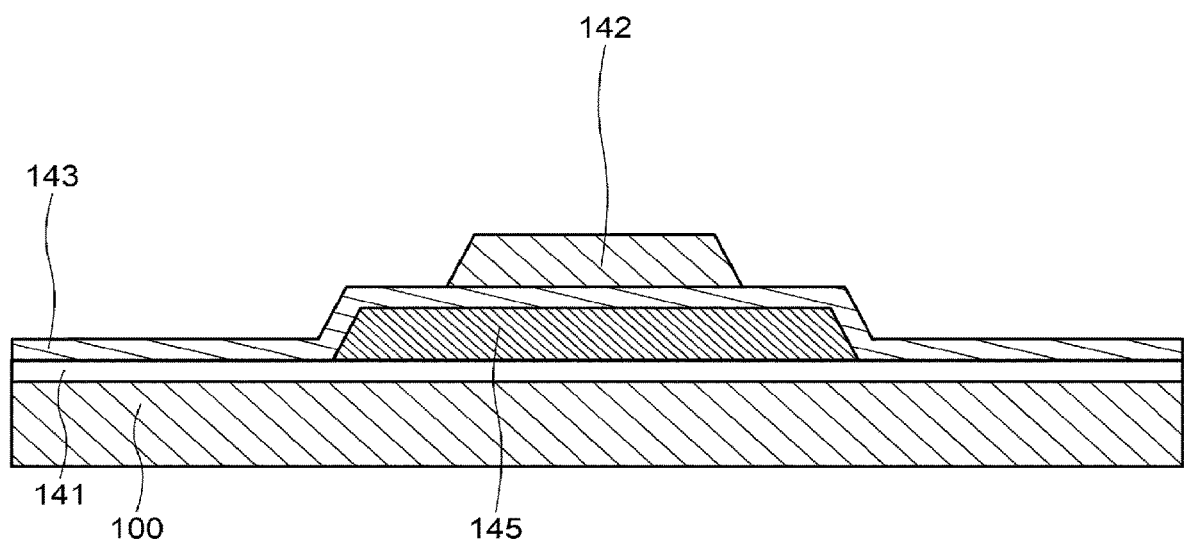
FIG. 8 is a cross-sectional view of a method for manufacturing a transistor according to an embodiment of the present invention.

Next, as shown in FIG. 8, the oxide semiconductor layer 142 is formed on the gate insulating layer 143. The oxide semiconductor layer 142 is formed by depositing an oxide semiconductor film on the gate insulating layer 143 and then processing to a desired shape by using a patterning method and an etching method. The oxide semiconductor film is preferably formed to a thickness of 30 nm or more and 100 nm or less at a deposition temperature of 250° C. or more and 450° C. or less by a sputtering method, for example.

When depositing the oxide semiconductor film by a sputtering method, a power supply applied to an oxide semiconductor target may be a direct current (DC) or an alternating current power supply (AC), and is determined by the shape and composition of the oxide semiconductor target. For example, as the oxide semiconductor target, a $In_2O_3:Ga_2O_3:ZnO=1:1:2$ (In:Ga:Zn:O=1:1:1:4) can be used for InGaZnO. The composition ratio can be determined in accordance with the purpose such as the characteristics of the transistor.

When the oxide semiconductor film is deposited, oxygen gas, a mixed gas of oxygen and a rare gas, or a rare gas may be used. In the present embodiment, it is preferable to perform sputtering in a mixed gas atmosphere of oxygen and a rare gas as a sputtering gas for depositing the oxide semiconductor film, and it is more preferable that the flow rate ratio of the oxygen gas to the rare gas is 5% or more. By setting the oxygen gas flow rate ratio to 5% or more, oxygen is easily added to the oxide semiconductor film, which is preferable.

The heat treatment may be performed after the oxide semiconductor layer 142 is formed. The heat treatment may be performed before the oxide semiconductor film is processed (the patterning process), or may be performed after the processing (the etching process). Since the oxide semiconductor layer 142 may shrink in volume due to the heat treatment, it is preferable to perform the heat treatment prior to processing. By performing the heat treatment on the oxide semiconductor layer 142, the quality of the film can be improved by reducing the hydrogen concentration of the oxide semiconductor layer 142, and increasing the hydrogen concentration, and the like.

The heat treatment performed on the oxide semiconductor layers 142 can be performed in the presence of nitrogen, dry air, or air at atmospheric pressure or at low pressure (vacuum). The heat treatment is carried out at 250° C. or higher and 500° C. or less, and preferably 350° C. or higher and 450° C. or less. The heating time is preferably performed in, for example, 15 minutes or more and 1 hours or less. By performing a heat treatment, oxygen is introduced into oxygen deficiencies in the oxide semiconductor layer 142 or oxygen is rearranged, whereby the oxide semiconductor layer 142 having few crystal defects and high crystallinity can be obtained. The heat treatment can reduce the hydrogen concentration of the oxide semiconductor layer 142. Thus, it is possible to produce the oxide semiconductor layer 142 with a small defect level density and a transistor with less characteristic variation.

Figure 9:
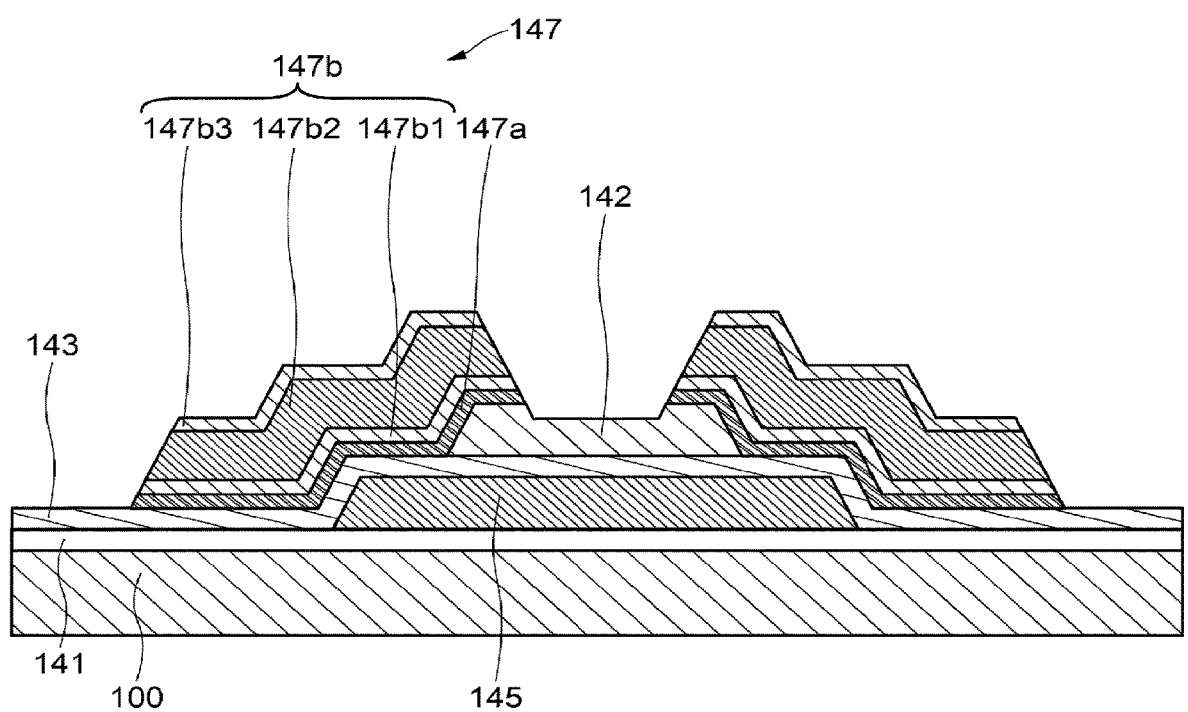
FIG. 9 is a cross-sectional view of a method for manufacturing a transistor according to an embodiment of the present invention.

Next, as shown in FIG. 9, the source/drain electrodes 147 are formed on the oxide semiconductor layer 142. First, the conductive film serving as the conductive layer 147a is formed on the oxide semiconductor layer 142. The conductive film serving as the conductive layer 147a is formed by a sputtering method using the materials described above. A forming method of the conductive film is not limited to a sputtering method. The conductive film may be formed by a CVD method or a print method. A thickness of the conductive layer 147a is preferably greater than or equal to 10 nm or more and 50 nm or less. In the present embodiment, titanium nitride formed by a sputtering method is used for the conductive layer 147a.

Next, a conductive film serving as the conductive layer 147b is formed on the conductive layer 147a. The conductive film serving as the conductive layer 147b is formed of a single layer structure or a stacked layer structure by a sputtering method using the above-described materials, but may also be formed by another method. The thickness of the conductive layer 147b is preferably 50 nm or more and 1000 nm or less. In this instance, the conductive layer 147b1, the conductive layer 147b2, and the conductive layer 147b3 are continuously formed for the conductive layer 147b. More specifically, a titanium film is formed by a sputtering method for the conductive layer 147b1. An aluminum film is formed by a sputtering method for the conductive layer 147b2. A titanium film is formed by a sputtering method for the conductive layer 147b3.

The conductive layer 147a and the conductive layer 147b are collectively processed by a patterning method and an etching method, whereby the source/drain electrodes 147 are formed into a desired shape. The conductive layer 147a and the conductive layer 147b may be separately processed instead of being processed collectively.

Figure 10:
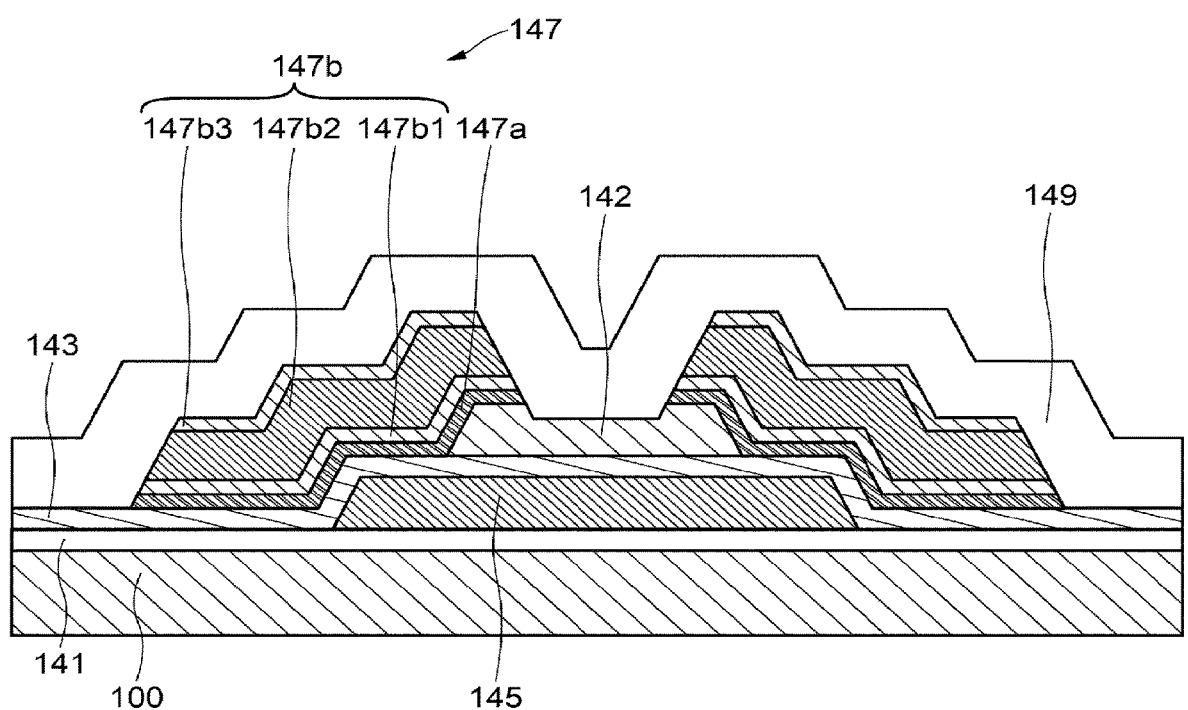
FIG. 10 is a cross-sectional view of a method for manufacturing a transistor according to an embodiment of the present invention.

Next, as shown in FIG. 10, the insulating layer 149 is formed on the oxide semiconductor layers 142 and the source/drain electrodes 147. The insulating layer 149 is formed by plasma-enhanced CVD, thermal CVD, or sputtering using the above-described materials to have a single layer structure or a stacked layer structure. The forming temperature of the insulating layer 149 is desirably 325° C. or more and 450° C. or less, and preferably 350° C. or more and 400° C. or less. A thickness of gate the insulating layer 149 is preferably 100 nm or more and 500 nm or less. The insulating layer 149 is preferably formed using a material capable of releasing oxygen by the heat treatment. For example, a silicon oxide film is preferably used for the insulating layer 149.

Next, after providing the insulating layer 149 in contact with the oxide semiconductor layer 142, a heat treatment is performed. The heat treatment may be carried out at atmospheric or low pressure (vacuum) in the presence of nitrogen, dry air, or air. The heat treatment is preferably carried out at 325° C. or higher and 450° C. or less, and preferably 350° C. or higher and 400° C. or less. The heating time is, for example, 15 minutes or more and 12 hours or less, and preferably 30 minutes or more and 2 hours or less. Oxygen can be supplemented for a damaged region (back-channel region) or oxygen deficiencies existing in the oxide semiconductor layer 142 caused by the heat treatment. As a result, oxygen deficiencies contained in the oxide semiconductor layer 142 can be reduced, and the oxide semiconductor layer 142 having few crystal defects and high crystallinity can be obtained. The heat treatment can reduce the hydrogen concentration of the oxide semiconductor layer 142. Furthermore, by the heat treatment, the defect level density contained in the gate insulating layer 143 and the insulating layer 149 is reduced. Thus, the defect level density of the entire transistor 110 is reduced.

When a heat treatment is performed after forming the insulating layer 149, oxygen diffuses from the oxide semiconductor layer 142 toward the source/drain electrodes 147. This allows the oxide semiconductor layer 142 to have a region ($n^+$ region). At this time, a part of the source/drain electrodes 147 may be oxidized by the diffused oxygen. For example, when titanium is used as the source/drain electrodes, the titanium reacts with the oxide semiconductor layer 142 to form a good $n^+$ layer region, but the titanium reacts easily with oxygen. For this reason, the reaction with oxygen further progresses due to the driving stress (temperature, voltage, light, or the like). As a result, in the transistor 110, there is a possibility that characteristic failure such as a decrease in drain current and fluctuation of the threshold voltage occurs.

On the other hand, in the present embodiment, the source/drain electrodes 147 include the conductive layer 147a containing nitrogen in a portion in contact with the oxide semiconductor layer 142. As a result, when the heat treatment is performed after forming the insulating layer 149, oxygen diffuses from the oxide semiconductor layer 142 toward the source/drain electrodes 147 (specifically, the conductive layer 147a). Therefore, a conductive region ($n^+$) is effectively formed, and oxidization of the entire the source/drain electrodes (specifically, the conductive layer 147b) can be suppressed.

At this time, the conductive layer 147c (also referred to as a third conductive layer) may be formed between the oxide semiconductor layers 142 and the conductive layer 147a of the source/drain electrodes by a heat treatment. The conductive layer 147c includes a metallic material and oxygen included in the conductive layer 147a. The conductive layer 147c may further include some metallic materials included in the oxide semiconductor layers 142. In this example, the conductive layer 147c may include titanium, oxygen, and indium, gallium, and zinc, respectively. At this time, a thickness of the conductive layer 147c is preferably 2 nm or more and 10 nm or less.

In the transistor 110 having the above configuration, a good ohmic contact can be formed between the oxide semiconductor layer 142 and the source/drain electrodes 147. In addition, the transistor 110 is prevented from oxidizing the entire source/drain electrodes due to stresses (such as temperature, voltages, and lights) when driving the display device. Furthermore, the defect level density in the gate insulating layer and the oxide insulating layer is reduced by forming the gate insulating layer and the oxide insulating layer at a high temperature and performing the heat treatment. Therefore, it is possible to suppress changes in characteristics such as a drain current and threshold voltage in the transistor 110 of the present embodiment. The transistor can have a high reliability. Therefore, the display device of the present embodiment can have a high display reliability by including the transistor 110.

Second Embodiment

In the present embodiment, a transistor having a configuration different from the first embodiment will be described. Specifically, the structure of the channel protection type transistor will be described with reference to the drawings. Descriptions of structures, materials, and manufacturing methods similar to those of the semiconductor device according to the first embodiment will be omitted as appropriate.
(2-1. Configuration of Transistor 110A)

Figure 11:
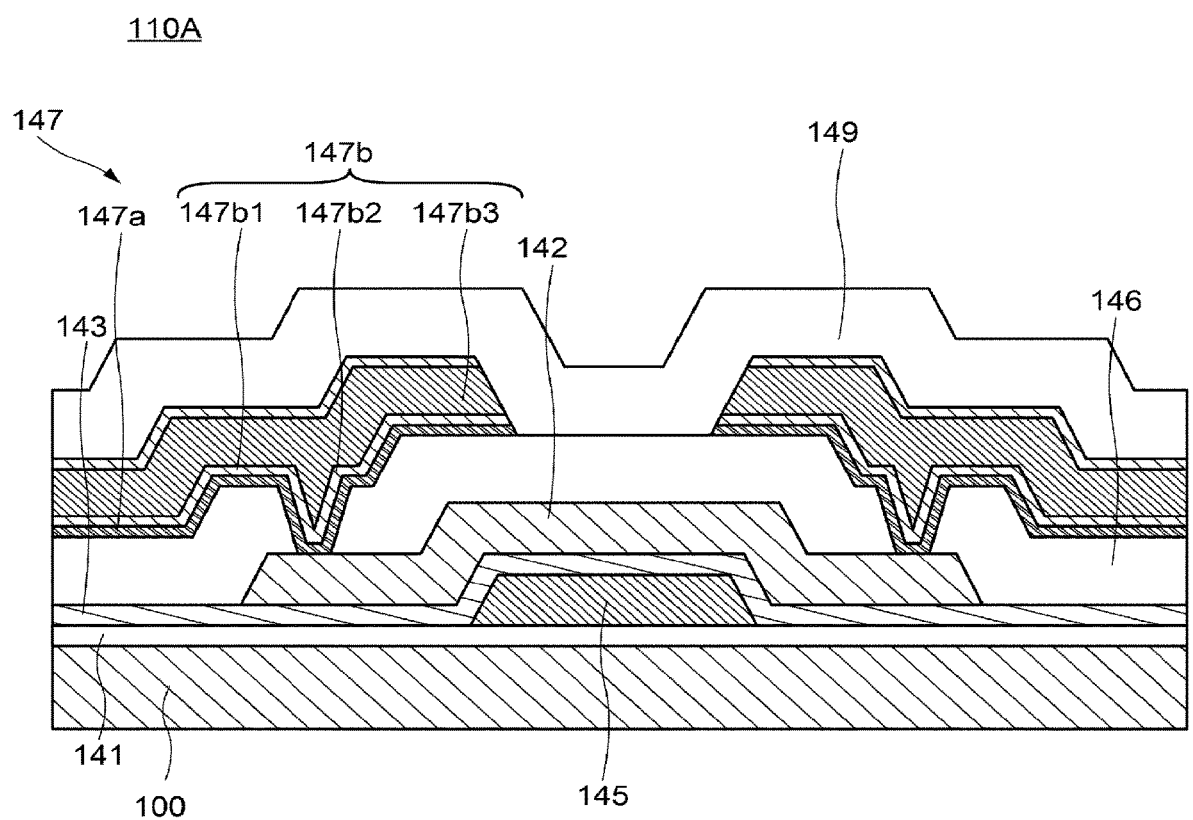
FIG. 11 is a cross-sectional view of a transistor according to an embodiment of the present invention.

FIG. 11 is a cross-sectional view of a transistor 110A according to the present embodiment. The transistor 110A is provided on an insulating layer 141. The transistor 110A has an insulating layer 146 in addition to the gate electrode 145, the gate insulating layer 143, oxide semiconductor 142, the source/drain electrodes 147, and the insulating layer 149.

The insulating layer 146 is provided on the gate insulating layer 143 and the oxide semiconductor layer 142. The insulating layer 146 is formed of the same material as the insulating layer 149. In the present embodiment, a silicon oxide film is used for the insulating layer 146.

The transistor 110A has a structure to protect the back-channel sides of the oxide semiconductor layer 142 by having the insulating layer 146 on the oxide semiconductor layer 142, unlike the transistor 110.
(2-2. Manufacturing Method of Transistor 110A)

Next, a manufacturing method of the transistor 110A according to the present embodiment will be described while referring to FIGS. 12 and 13. First, as described in the first embodiment, the oxide semiconductor layer 142 is formed on the gate insulating layer 143.

Figure 12:
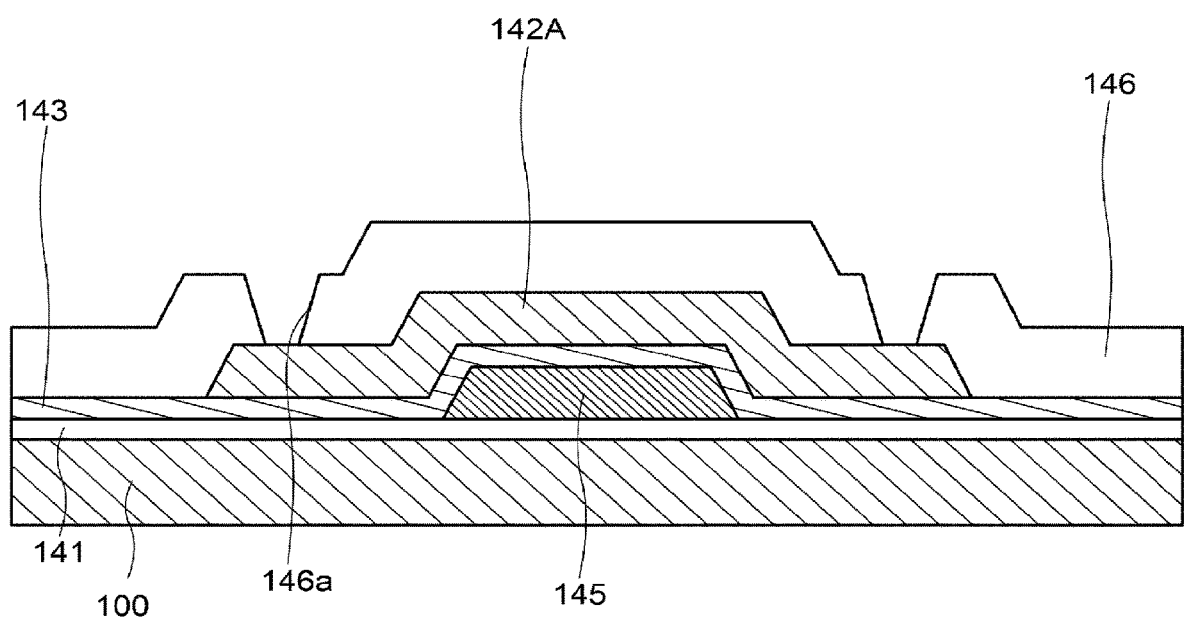
FIG. 12 is a cross-sectional view of a method for manufacturing a transistor according to an embodiment of the present invention.

Next, as shown in FIG. 12, the insulating layer 146 is formed on the gate insulating layer 143. The insulating layer 146 is preferably formed in a manner similar to that of the insulating layer 149. The forming temperature of the insulating layer 146 is desirably 325° C. or more and 450° C. or less, and preferably 350° C. or more and 400° C. or less. After the insulating layer 146 is formed, a heat treatment may be performed as appropriate. The heating treatment is 325° C. or higher and 450° C. or less, preferably 350° C. or higher and 400° C. or less, and preferably carried out in 15 minutes or more and 12 hours or less, and preferably 30 minutes or more 2 hours or less. Thereafter, an opening 146a is formed on the oxide semiconductor layer 142 by a patterning method and a dry-etching method.

Figure 13:
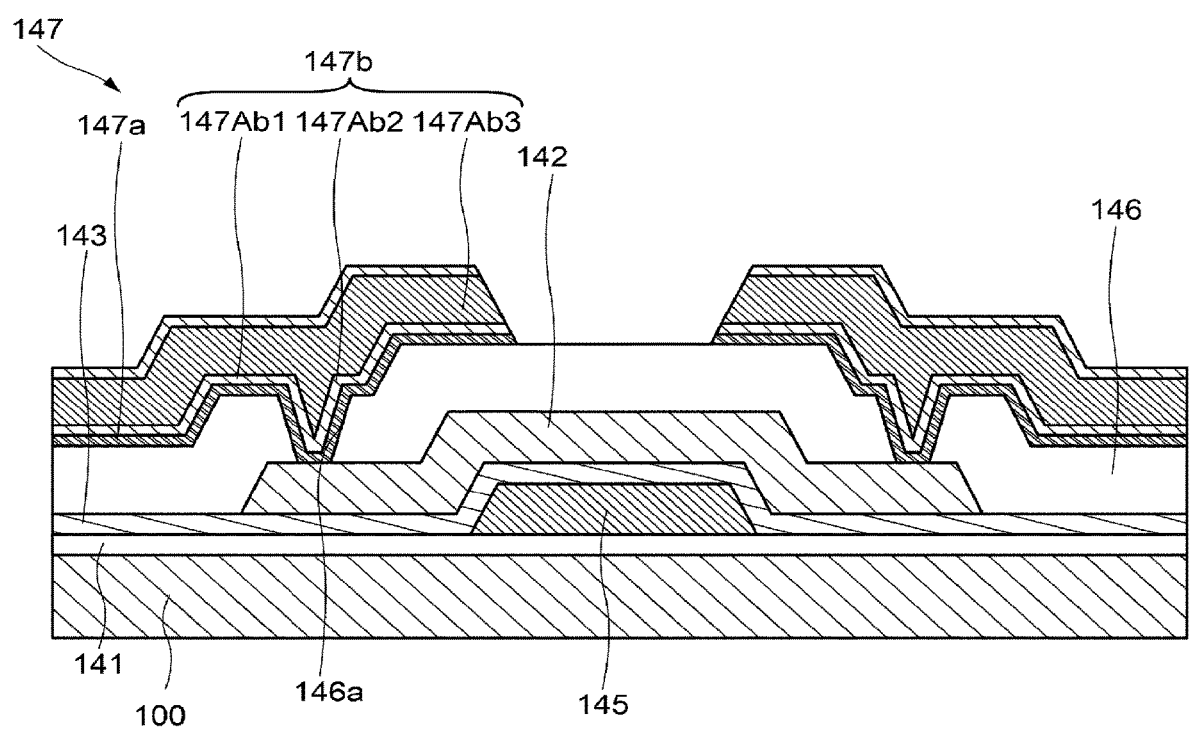
FIG. 13 is a cross-sectional view of a method for manufacturing a transistor according to an embodiment of the present invention.

Next, as shown in FIG. 13, the source/drain electrodes 147 are form ed on the insulating layer 146. The processes after forming the source/drain n electrodes 147 are the same as those in the first embodiment.

By using the present embodiment, it is possible to form a good ohmic contact between the oxide semiconductor layer 142 and the source/drain electrodes 147, while protecting the oxide semiconductor layer 142. Furthermore, oxidation in the entire source/drain electrodes 147 (specifically the conductive layer 147b) due to the stress when driving the display device (temperature, voltage, and light, etc.) can be suppressed. Therefore, it is possible to provide a transistor having a high reliability, and it is possible to provide a display device having a high reliability.

Third Embodiment

In the present embodiment, a transistor having a configuration different from the first embodiment will be described. Specifically, a transistor 110B having a top-gate structure will be described while referring to FIG. 14. A description of a structure, a material, and a manufacturing method similar to those of the transistor according to the first embodiment and the second embodiment is omitted.
(3-1. Configuration of Transistor 110B)

Figure 14:
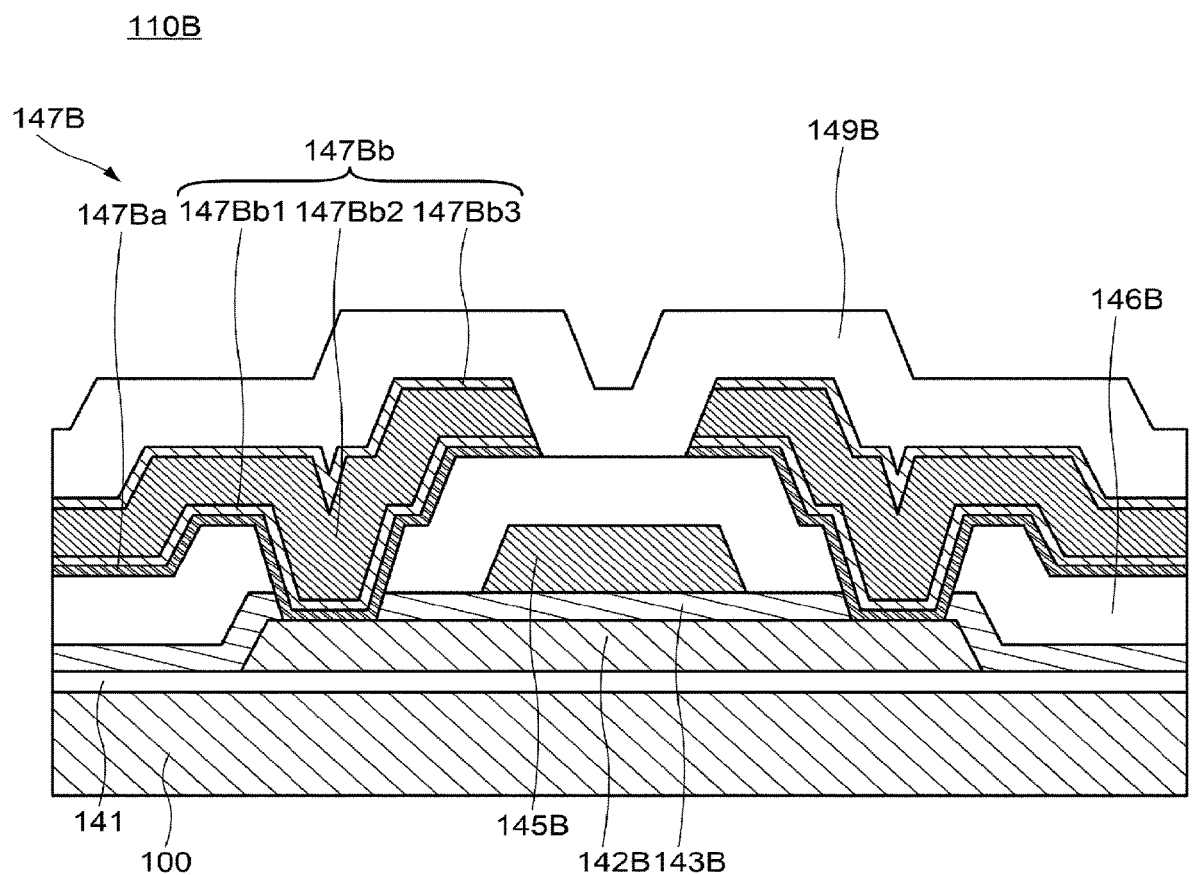
FIG. 14 is a cross-sectional view of a transistor according to an embodiment of the present invention.

FIG. 14 is a cross-sectional view of a transistor 110B according to the present embodiment. As shown in FIG. 14, a transistor 110B is provided on an insulating layer 141 and has an oxide semiconductor layer 142B, a gate insulating layer 143B, a gate electrode 145B, an insulating layer 146B, source/drain electrodes 147B, and an insulating layer 149B.

The oxide semiconductor layer 142B is arranged on the insulating layer 141. The gate insulating layer 143B is arranged on the insulating layer 141 and the oxide semiconductor layer 142B. The gate electrode 145B is arranged on the gate insulating layer 143B. The insulating layer 146B is arranged on the gate insulating layer 143B and the gate electrode 145B. The source/drain electrodes 147B are arranged on the insulating layer 146B and in contact with the oxide semiconductor layer 142B. The insulating layer 149B is arranged on the insulating layer 146B and the source/drain electrodes 147B.

The transistor 110B, unlike the transistor 110, is provided with the gate electrode 145B on the oxide semiconductor layers 142B. The transistor 110B can be reduced in transistor size compared to the transistor 110 by controlling the size of the gate electrode 145B. The oxide semiconductor layer 142B is entirely covered by the insulating layer 146B, and a defect such as oxygen-deficiency in the oxide semiconductor layer 142B can be reduced by forming and heattreating the insulating layer 146B. Thus, a good ohmic contact can be formed between the oxide semiconductor layer 142 and the source/drain electrodes 147 while protecting oxide semiconductor layer. Furthermore, the entire source/drain electrodes 147 (specifically, conductive layer 147b) is suppressed from being oxidized by stresses (temperatures, voltages, lights, and the like) when driving the display device. Therefore, by using the present embodiment, it is possible to provide a transistor having a high reliability, and it is possible to provide a display device having a high reliability.

Fourth Embodiment

In the present embodiment, a display device having a configuration different from the first embodiment will be described while referring to FIG. 15. Specifically, in the pixel 103 shown in FIGS. 1 and 3, a display device using a liquid crystal device will be described. In this embodiment, the transistor 110 described in the first embodiment is used, but the transistor 110A of the second embodiment and the transistor 110б of the third embodiment may also be used.
(Configuration of Pixel 103C)

Figure 15:
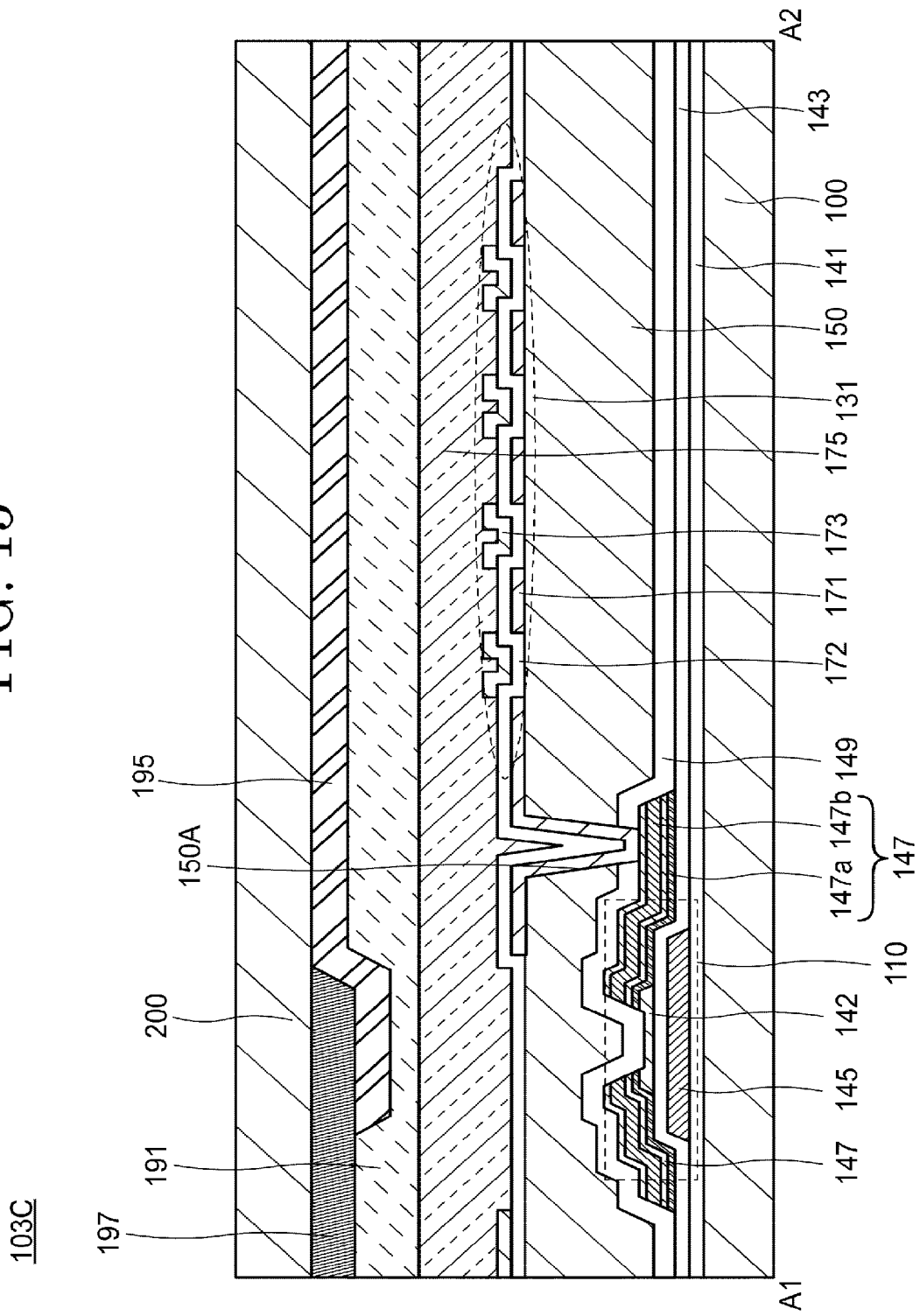
FIG. 15 is a cross-sectional view of a pixel of a display device according to an embodiment of the present invention.

FIG. 15 is a cross-sectional view of the pixel 103C. The pixel 103C includes a liquid crystal element 131, a color filter layer 195 and a light shielding layer 197 in addition to the substrate 100, an insulating layer 141, transistor 110, the planarization layer 150, and the substrate 200.

A pixel electrode 171 is provided on the planarization layer 150. The pixel electrode 171 is formed of a transparent conductive material. In this example, indium tin oxide (ITO) is used. Note that the present invention is not limited thereto, and zinc oxide (ZnO), and indium zinc oxide (IZO), or the like may be used. The pixel electrode 171 is connected to the source/drain electrodes 147 via an opening. The pixel electrode 171 is separated pixel by pixel and provided in a comb shape in a planar view.

An insulating layer 172 is provided on the pixel electrode 171. A silicon oxide film or a silicon nitride film is used for the insulating layer 172. A common electrode 173 is provided on the insulating layer 172. A material similar to those of the pixel electrode 171 can be used for the common electrode 173. The common electrode 173 is provided across respective pixels in a planar view. In the present embodiment, the common electrode 173 is arranged on the upper side of the pixel electrode 171, but the present invention is not limited thereto, and the common electrode 173 may be arranged on the lower side of the pixel electrode 171. In a cross-sectional view of the present embodiment, the common electrode 173 is also provided in a comb-tooth shape, but may be provided continuously.

The light shielding layer 197 is provided on the side of substrate 200. The light shielding layer 197 has a light shielding function. For example, in addition to a resin in which a pigment is dispersed, and a resin containing a dye, an inorganic film such as a black chromium film, carbon black, a composite oxide containing a solid solution of a plurality of inorganic oxides, and the like can be used for the light shielding layer 197.

The color filter layer 195 is provided on an opening of the light shielding layer 196. The color filter layer 195 has a function of transmitting light of a specific wavelength band with respect to light transmitted from the liquid crystal element 131 and emitted. For example, light in a red, green, or blue wavelength band can be transmitted.

A planarization layer 191 is provided on the color filter layer 195 and the light shielding layer 197. The planarization layer 191 is formed using a material similar to that of the planarization layer 150.

A liquid crystal layer 175 is provided between the common electrode 173 and the planarization layer 191. An FFS (Fringe Field Switching) type liquid crystal element is used for the liquid crystal element 131 of the present embodiment composed of the pixel electrode 171, the common electrode 173 and the liquid crystal layer 175. Note that the present invention is not limited thereto, and various types of liquid crystal elements such as a TN type and VA type may be used.

In the present embodiment, it is possible to suppress the variation of the transistor characteristics against driving stress for a long period by using the transistor 110. Therefore, it is possible to provide a highly reliable liquid crystal display device.

Example 1

In this example, a transistor according to an embodiment of the present invention is formed, and the results of performing an elemental analysis of the interfaces of the oxide semiconductor layer and the source/drain electrodes will be described.

Figure 16:
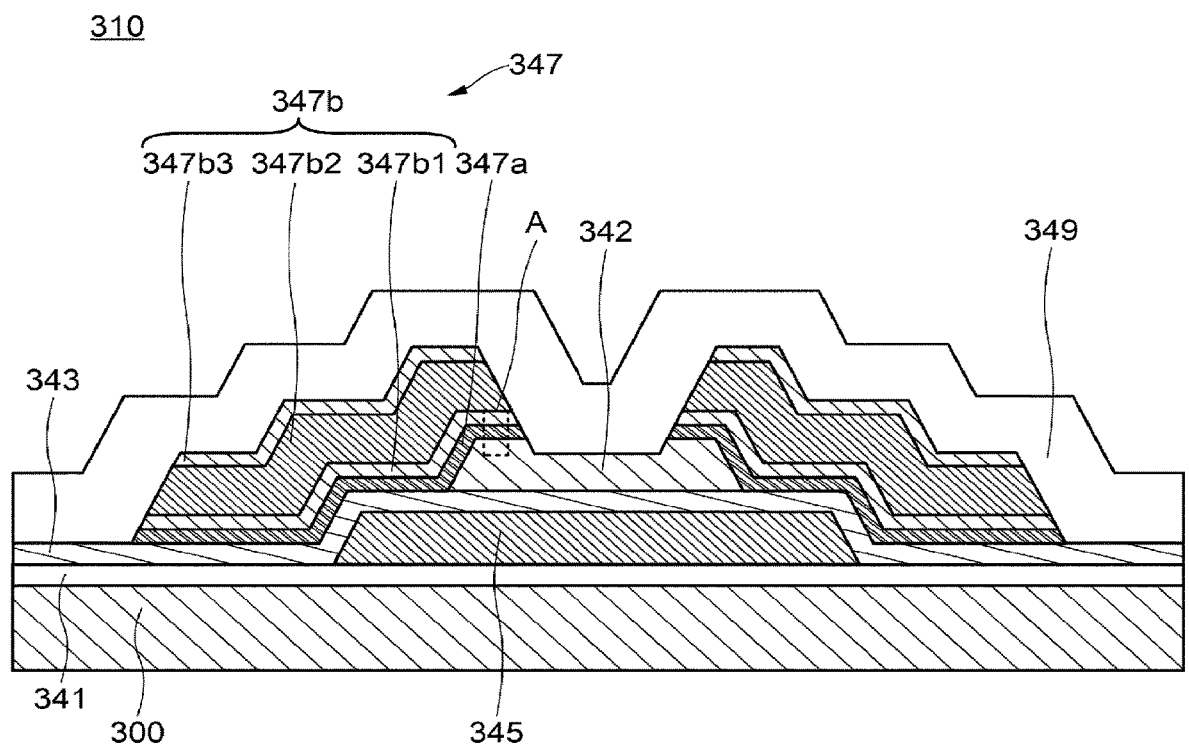
FIG. 16 is a cross-sectional view of a transistor according to an embodiment of the present invention.

Hereinafter, the transistor manufactured in this example will be described. FIG. 16 is a cross-sectional view of a transistor 310 formed in this example. The transistor 310 has a gate electrode 345, a gate insulating layer 343, an oxide semiconductor layer 342, source/drain electrodes 347, and an insulating layer 349 on a substrate 300, which is a sixth-generation glass substrate (1500 mm×1850 mm) and an insulating layer 341. The transistor 310 has the same configuration as the transistor 110 of the first embodiment of the present invention. The manufacturing method of the transistor 310 is shown below.

First, the insulating layer 341 of silicon oxide was formed on the substrate, and the gate electrode 345 was formed thereon. An alloy film of molybdenum and tungsten (MoW) having a thickness of 200 nm was deposited as the gate electrode 345 by a DC sputtering method, and processed by a patterning method and a dry etching method.

Next, the gate insulating layer 343 was formed on the gate electrode 345. A stacked film of a silicon nitride film with a thickness of 150 nm and a silicon oxide film with a thickness of 100 nm was formed at 350° C. by plasma-CVD for the gate insulating layer 343.

Next, an oxide semiconductor layer 342 was formed on the gate insulating layer 343, so as to overlap the gate electrode 345. A IGZO film having a thickness of 75 nm was deposited at 100° C. by an AC sputtering method, and was processed using a patterning method and a dry etching method to form the oxide semiconductor layer 342.

Next, the source/drain electrodes 347 were formed on the oxide semiconductor layer 342. Titanium nitride (TiN) having a film thickness of 20 nm, titanium (Ti) having a film thickness of 50 nm, aluminum (Al) having a film thickness of 200 nm, and titanium (Ti) having a film thickness of 50 nm were laminated to form a film by a sputtering method and processed collectively by a patterning method and a dry etching method to form the source/drain electrodes 347.

Next, the insulating layer 349 was formed on the source/drain electrodes 347. A silicon oxide film having a film thickness of 300 nm was formed by plasma CVD at 350° C. as the insulating layer 349.

Next, a heat treatment was performed at 350° C. for 30 minutes in an atmosphere of dry air. In this way, the transistor 310 of the present example was manufactured.

Figure 17:
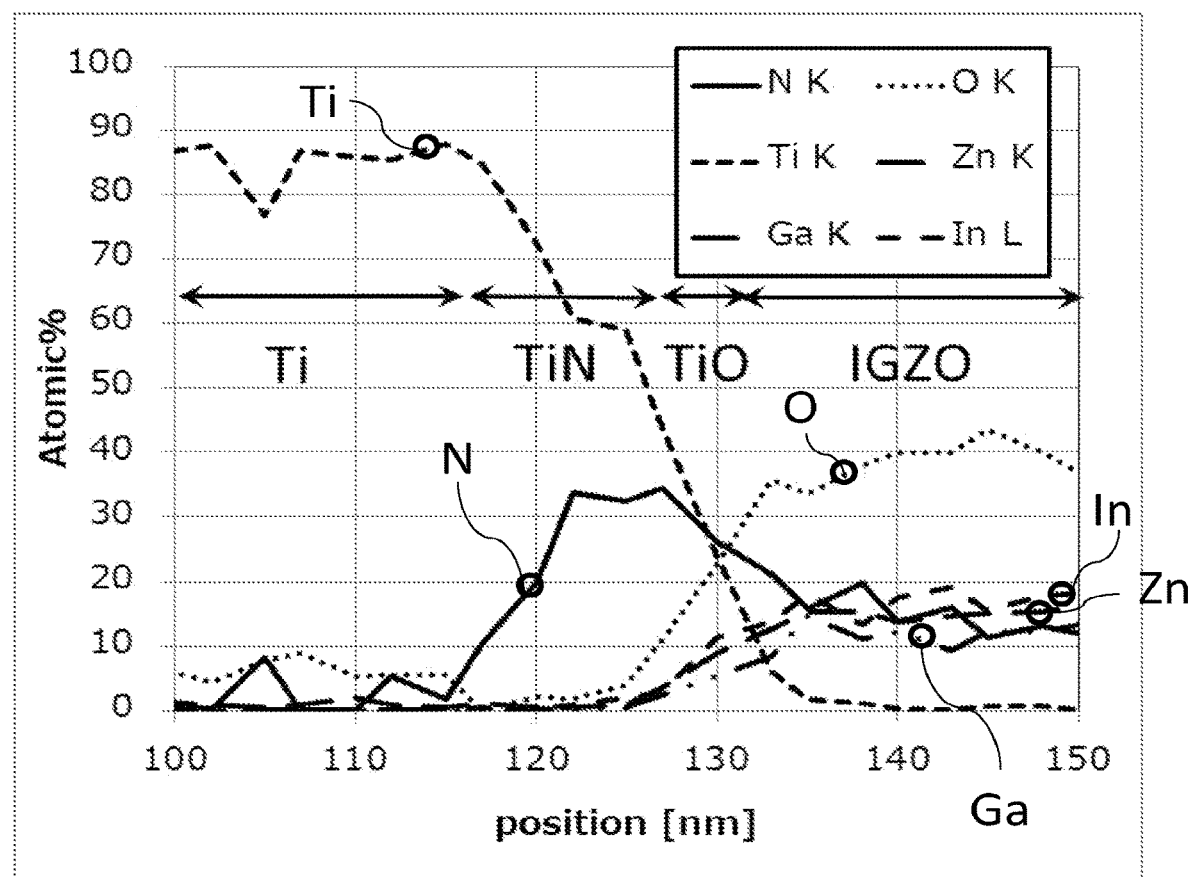
FIG. 17 is an EDX measurement result of a part of the transistor according to the present example.

FIG. 17 shows a transmission electron microscopy-energy dispersive X-ray spectrometry (TEM-EDX) of the interface region A of the oxide semiconductor layer 342 and source/drain electrodes 347 of the transistor 310 after forming the insulating layer 349 and performing a heat treatment. As shown in FIG. 17, IGZO, titanium oxide (TiO), titanium nitride (TiN), and titanium (Ti) were detected at the interface between the oxide semiconductor layer 342 and the source/drain electrodes 347. That is, in this example, the diffusion of the constituent elements occurs between the titanium nitride film and IGZO film by a heat treatment after forming the insulating layer 349, and it was found that titanium oxide (TiO) is formed. At this time, the film thickness of the TiO film was about 5 nm.

Example 2

In this example, a transistor according to an embodiment of the present disclosure is manufactured on a large-sized substrate, and the result of evaluating Id-Vg characteristics will be described.

In this example, the transistor 310 was manufactured on a sixth-generation glass substrate (1500 mm×1850 mm). The conditions for manufacturing the transistor 310 are the same as those in Example 1. In this example, the Id-Vg characteristics of 84 transistors manufactured on the sixth-generation glass substrate were evaluated. Measurement of the Id-Vg characteristics of the transistor 310 was performed by applying −15 V to +15V as the voltage (Vg) in 0.1V steps from to the gate electrode 345 of the transistor 310. The voltage applied to the source electrode of the source/drain electrodes 347 (Vs) was 0V, and the voltage applied to drain electrode (Vd) was 0.1V and 10V. The Id-Vg characteristics were measured at room temperature.

Figure 18:
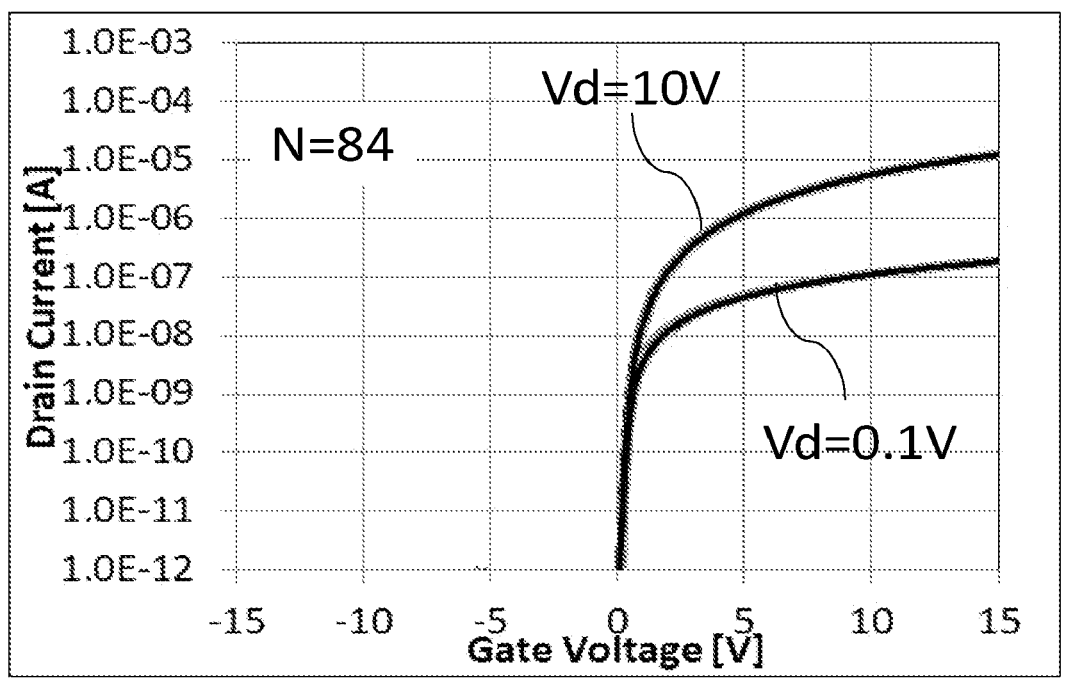
FIG. 18 is a result of an Id-Vg characterization evaluation of a transistor according to the present example.

FIG. 18 shows the Id-Vg characteristics of 84 transistors manufactured on a sixth-generation glass substrate. Table 1 summarizes the Id-Vg characteristics of 84 transistors, field-effect mobility (μFE), threshold voltage (Vth), and subthreshold value (S. S.). The Field-effect mobility (μFE) is the channel mobility determined from the change in drain current with respect to the gate voltage when the drain voltage is constant in the linear region of a metal oxide semiconductor field-effect transistor (MOSFET) operation. The threshold voltage (Vth) is the gate voltage required to carry the drain current in the MOSFET. The subthreshold value (S.S.) is the rate at which the current (drain current) of the MOSFET increases with respect to the voltage (gate voltage).

TABLE 1

| | μFE(cm$^2$/V · s) | Vth(V) | S.S.(V/decade) |
|---|---|---|---|
| Average | 12.36 | 0.65 | 0.10 |
| 3σ | 1.88 | 0.17 | 0.05 |
| Max. | 13.66 | 0.73 | 0.12 |
| Min. | 11.30 | 0.53 | 0.07 |

As shown in FIG. 18 and Table 1, the mean, 3σ, Max, and Min of the field-effect mobility (μFE cm$^2$/V·s) of the 84 transistors 310 were 12.36, 1.88, 13.66, and 11.30, respectively. The mean (Average), 3σ, max (Max), and min (Min) of the threshold voltages (Vth(V)) were 0.65, 0.17, 0.73, and 0.53, respectively. The mean (Average), 3σ, max (Max), and min (Min) of the subthreshold values (S.S. (V/decade)) were 0.10, 0.05, 0.12, and 0.07, respectively. Therefore, in the transistor 310 of the present example, variations in the characteristics were not observed and it was found to exhibit stable characteristics.

Example 3

In the present embodiment, a transistor according to an embodiment of the present invention is manufactured on a large size substrate, and the reliability of the Id-Vg characteristics will be described.

In this example, a gate bias-thermal stress test (hereinafter referred to as a GBT test) was performed for the manufactured transistor 310. As the GBT test in this example, the gate voltage (Vg) is −40 V, the drain voltage (Vd) and the source voltage (Vs) was 0 V, the stress temperature was 125° C., and the measurement environment was dark. The Id-Vg characteristics of the transistors 310 were measured at stress times of 0 sec, 100 sec, 500 sec, and 1000 sec.

Figure 19:
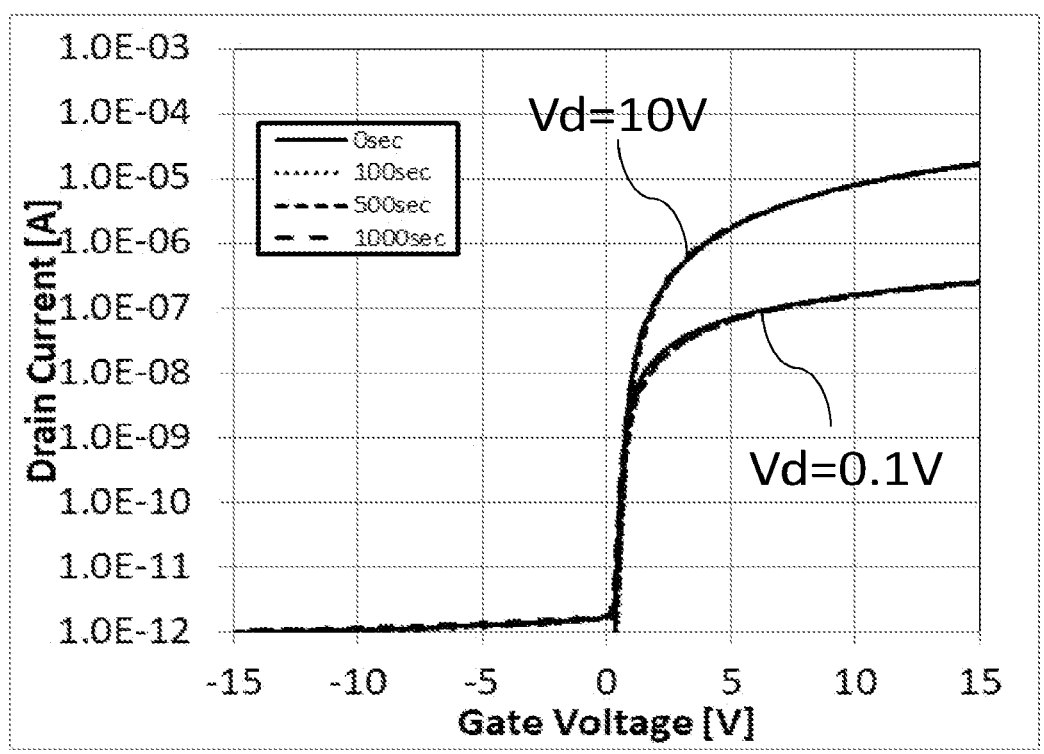
FIG. 19 is a reliability evaluation result of the transistor according to the present example.

FIG. 19 shows the results of evaluating the reliability of the Id-Vg characteristics. As shown in FIG. 19, even when the stress time of 1000 sec had elapsed, a change in characteristics was not seen in the transistor 310 of this example.

As a comparative example, the following transistors 410 were prepared to evaluate the reliability of the Id-Vg characteristics.

Comparative Example

Figure 20:
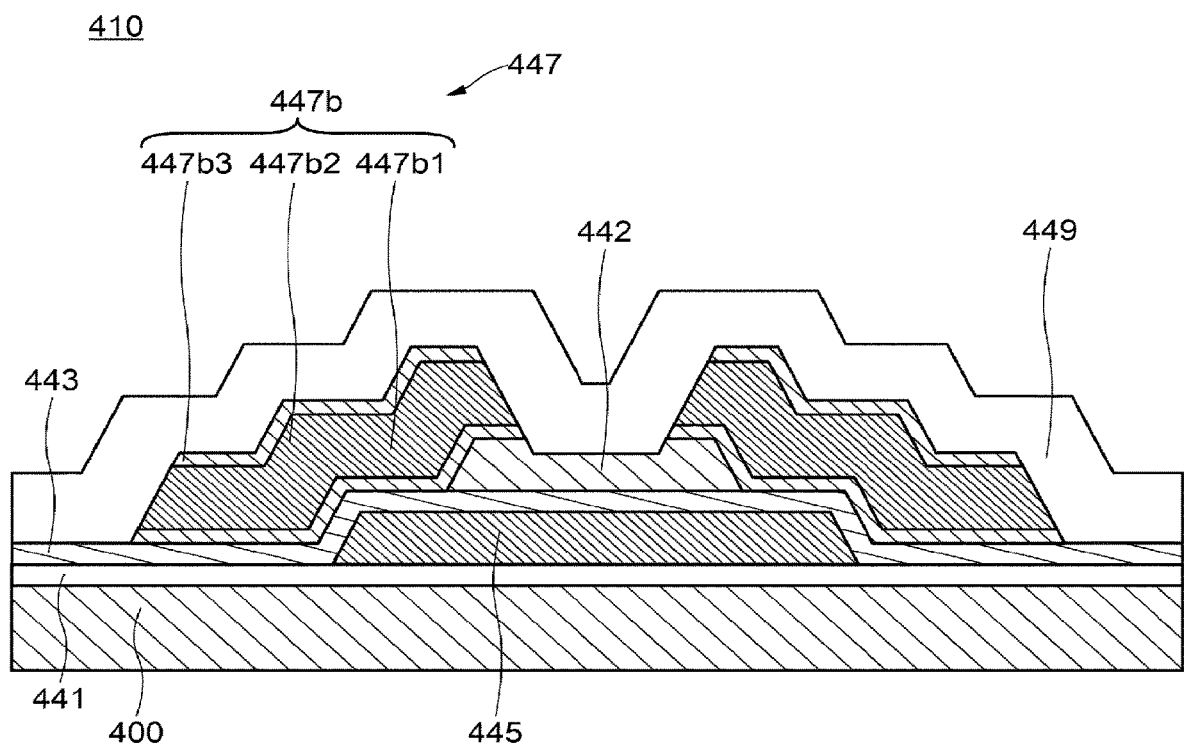
FIG. 20 is a cross-sectional view of a transistor according to a comparative example.

FIG. 20 is a cross-sectional view of a transistor 410 of the comparative example. The comparative transistor 410 has a substrate 400, a gate electrode 445, a gate insulating layer 443, oxide semiconductor layers 442, source/drain electrodes 447, and an insulating layer 449 on an insulating layer 441. The transistor 410 is similar to the transistor 310 except that the source/drain electrodes 447 do not have a nitrogen-containing conductive layer 347a in contact with the oxide semiconductor layer 342, as does the transistor 310. In the transistor 410, the temperature of the gate insulating layer 443 and the insulating layer 449, and the heat treatment temperature after the deposition is 300° C. or less, and oxide (specifically, titanium oxide) was not formed between an oxide semiconductor layer 442 and the source/drain electrodes 447.

Figure 21:
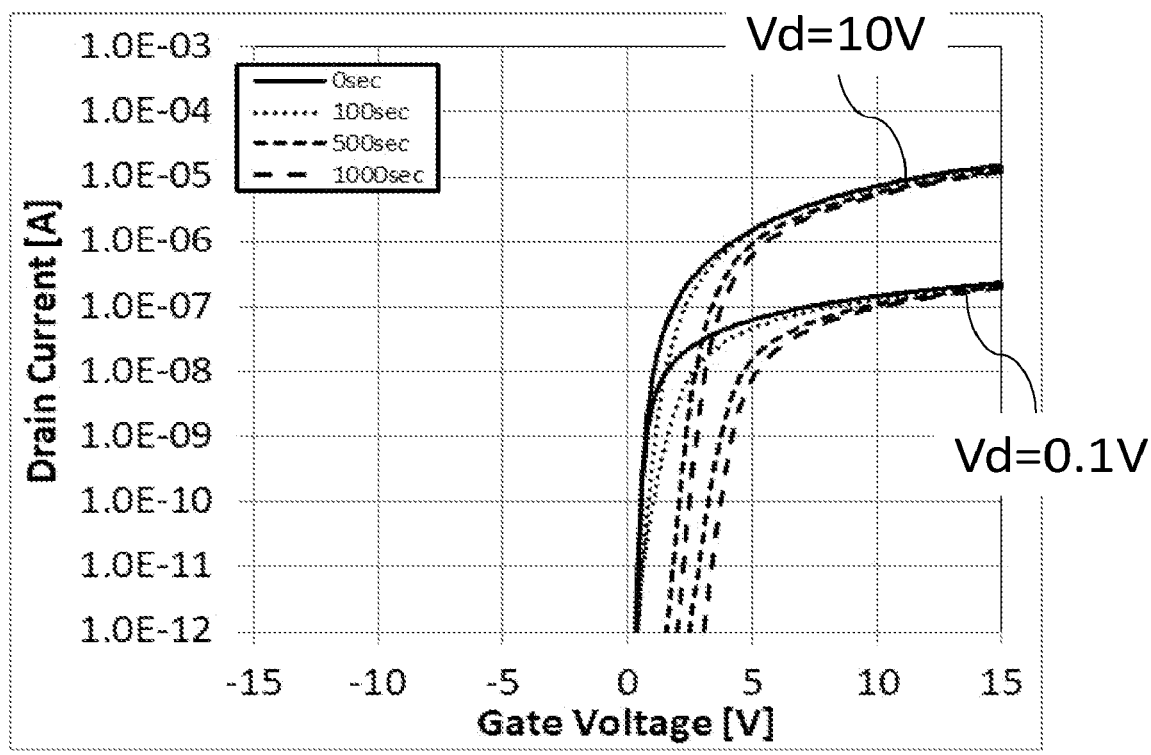
FIG. 21 is a reliability evaluation result of the transistor according to the comparative example.

FIG. 21 shows the results of the Id-Vg characteristics of the transistor 310, in a comparative example. As shown in FIG. 21, in the transistor 410 of the comparative example, it was found that Id-Vg characteristics varied with an increase in the stress application period.

From the results of this example, it was found that it is possible to suppress the variation of the transistor characteristics by using the transistor of the embodiment of the present invention.

As described above, by using the transistor according to the embodiment of the present disclosure, it is possible to provide a highly reliable display device in which variation in transistor characteristics can be suppressed.

Within the spirit of the present invention, it is understood that various modifications and modifications can be made by those skilled in the art, and that these modifications and modifications also fall within the scope of the present invention. For example, as long as the gist of the present invention is provided, deletions, or changes to the design of components or additions, omissions, or changes to the conditions of processes to each of the above-described embodiments by a person skilled in the art are included in the scope of the present invention.

(Modifications)

In the first to third embodiments of the present disclosure, the source/drain electrodes 147 is provided on an oxide semiconductor layer 142, but the present invention is not limited thereto. The oxide semiconductor layer 142 may be provided on the source/drain electrodes 147. The conductive layer 147a may be provided on the source/drain electrodes 147. A gate electrode may be provided on the top side of the oxide semiconductor layers 142, or it may be sandwiched by two gate electrodes provided on the top and bottom sides of the oxide semiconductor 142.

What is claimed is:

1. A display device comprising:
    a transistor; and
        a display element over the transistor;
        wherein the transistor includes:
        a gate electrode on an insulating surface;
        a gate insulating layer on the gate electrode;
        an oxide semiconductor layer arranged on the gate insulating layer, and overlapping the gate electrode;
        source/drain electrodes, each of the source/drain electrodes including a first conductive layer above the oxide semiconductor layer, a second conductive layer on the first conductive layer, and a third conductive layer between the first conductive layer and the oxide semiconductor layer; and
        an insulating layer overlapping the first to third conductive layers, the oxide semiconductor layer, and the gate electrode, the insulating layer containing oxygen and being on and in physical contact with a top surface of the first conductive layer,
        wherein the first conductive layer contains titanium and nitrogen,
        the second conductive layer contains a metal material,
        the third conductive layer contains titanium, oxygen, and a part of the metal materials contained in the oxide semiconductor layer,
        the first and second conductive layers are not in physical contact with the oxide semiconductor layer, and
        the third conductive layer is on and in physical contact with the oxide semiconductor layer.

2. The display device according to claim 1, wherein a thickness of the third conductive layer is 2 nm or more and 10 nm or less.

3. The display device according to claim 1, wherein an oxygen content in the third conductive layer is 10 atomic % or more.

4. The display device according to claim 1, wherein the third conductive layer contains titanium oxide.

5. The display device according to claim 4, wherein the third conductive layer contains indium, gallium, and zinc.

6. The display device according to claim 1, wherein the third conductive layer contains indium, gallium, and zinc.

7. A method for manufacturing a display device, the method comprising:
    forming a gate electrode on an insulating surface;
    forming a gate insulating layer on the gate electrode;
    forming an oxide semiconductor layer on the gate insulating layer, the oxide semiconductor layer including an area overlapping the gate electrode;
    forming source/drain electrodes, each of the source/drain electrodes including a first conductive layer above the oxide semiconductor layer, a second conductive layer on the first conductive layer, and a third conductive layer between the first conductive layer and the oxide semiconductor layer;
    forming an insulating layer overlapping the first to third conductive layers, the oxide semiconductor layer, and the gate electrode and being on and in physical contact with a top surface of the first conductive layer;
    forming a transistor by performing a heat treatment;
    forming the third conductive layer by performing the heat treatment; and
    forming a display element over the transistor,
        wherein the first conductive layer contains titanium and nitrogen,
        the second conductive layer contains a metal material,
        the third conductive layer contains titanium, oxygen, and a part of the metal materials contained in the oxide semiconductor layer,
        the first and second conductive layers are not in physical contact with the oxide semiconductor layer, and
        the third conductive layer is on and in physical contact with the oxide semiconductor layer.

8. The method for manufacturing a display device according to claim 7, wherein
    a temperature of forming the gate insulating layer and a temperature of the heat treatment are 325° C. or more and 400° C. or less.

9. The method for manufacturing a display device according to claim 8, the method further comprising:
    forming a third conductive layer containing oxygen between the oxide semiconductor layer and the first conductive layer by performing the heat treatment.

10. The method for manufacturing a display device according to claim 7, wherein
    a temperature of forming the gate insulating layer and a temperature of the heat treatment are 350° C. or more and 400° C. or less.

11. The method for manufacturing a display device according to claim 7, wherein
    the third conductive layer contains titanium oxide.

12. The method for manufacturing a display device according to claim 11, wherein
    the third conductive layer contains indium, gallium, and zinc.

13. The method for manufacturing a display device according to claim 7, wherein
    the third conductive layer contains indium, gallium, and zinc.

* * * * *